(12) United States Patent
Jang

(10) Patent No.: US 11,217,179 B2
(45) Date of Patent: Jan. 4, 2022

(54) SCAN DRIVER AND DISPLAY DEVICE INCLUDING THE SAME

(71) Applicant: Samsung Display Co., Ltd., Yongin-Si (KR)

(72) Inventor: Hwan Soo Jang, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/899,664

(22) Filed: Jun. 12, 2020

(65) Prior Publication Data
US 2021/0158760 A1    May 27, 2021

(30) Foreign Application Priority Data
Nov. 21, 2019   (KR) .......................... 10-2019-0150380

(51) Int. Cl.
*G09G 3/3291* (2016.01)
*G09G 3/3266* (2016.01)

(52) U.S. Cl.
CPC ......... *G09G 3/3266* (2013.01); *G09G 3/3291* (2013.01); *G09G 2310/0202* (2013.01)

(58) Field of Classification Search
CPC ............... G09G 3/3266; G09G 3/3291; G09G 2310/0202
See application file for complete search history.

(56) References Cited

U.S. PATENT DOCUMENTS

| | | | |
|---|---|---|---|
| 9,548,026 B2 | 1/2017 | Jang | |
| 2006/0001637 A1* | 1/2006 | Pak ...................... | G11C 19/184 345/100 |
| 2013/0285888 A1* | 10/2013 | Chung ................... | G11C 19/28 345/55 |
| 2018/0047344 A1* | 2/2018 | Sun ....................... | H03K 17/102 |
| 2018/0158409 A1* | 6/2018 | Byun ..................... | G09G 3/3233 |
| 2018/0330673 A1 | 11/2018 | Kang et al. | |
| 2018/0357965 A1 | 12/2018 | Chung et al. | |
| 2019/0035322 A1* | 1/2019 | Kim ....................... | G09G 3/3266 |

FOREIGN PATENT DOCUMENTS

| | | |
|---|---|---|
| KR | 10-2018-0125670 A | 11/2018 |
| KR | 10-2018-0136012 A | 12/2018 |

* cited by examiner

*Primary Examiner* — Towfiq Elahi
(74) *Attorney, Agent, or Firm* — Innovation Counsel LLP

(57) ABSTRACT

Provided herein is a scan driver including scan stages. A first scan stage includes a first transistor including a gate electrode coupled to a first node, a first electrode coupled to a first power clock line, and a second electrode coupled to a first scan line; a first capacitor connected between the first node and the first scan line; a second transistor including a gate electrode coupled to a second node, a first electrode coupled to the first scan line, and a second electrode coupled to a first power line; a third transistor including a gate electrode coupled to the second node, a first electrode coupled to a third node, and a second electrode coupled to a first control clock line; and a second capacitor connected between the second node and the third node.

20 Claims, 16 Drawing Sheets

<High Driving Frequency>

<Low Driving Frequency>

SCAN DRIVER AND DISPLAY DEVICE INCLUDING THE SAME

CROSS-REFERENCE TO RELATED APPLICATION

The present application claims priority to Korean patent application number 10-2019-0150380 filed on Nov. 21, 2019, the entire disclosure of which is incorporated herein in its entirety by reference.

BACKGROUND

Field

Various embodiments of the present disclosure relate to a scan driver and a display device including the scan driver.

Description of Related Art

With the development of information technology, the importance of a display device that is a connection medium between a user and information has been emphasized. Owing to the importance of the display device, the use of various display devices such as a liquid crystal display device, an organic light-emitting display device, and a plasma display device has increased.

Each pixel of the display device may emit light at a luminance corresponding to data voltage supplied through a data line. The display device may display an image frame by a light emission combination of pixels.

A plurality of pixels may be coupled to each data line. Thus, there is a need for a scan driver that provides a scan signal for selecting a pixel to which data voltage is to be supplied among the plurality of pixels. The scan driver is configured in the form of a shift register to which a plurality of scan stages is coupled, and the scan driver may sequentially provide turn-on level scan signals on the basis of scan lines.

Each scan stage is required to have a sufficiently large voltage difference between a gate electrode and a source electrode of a buffer transistor, so as to supply scan signals to all pixels of a pixel row (e.g. pixels coupled to the same scan line).

Furthermore, each scan stage may include a plurality of capacitors, and it is required to reduce power consumption by minimizing the charge and discharge of the capacitors.

SUMMARY

Various embodiments of the present disclosure are directed to a scan driver and a display device including the scan driver, which can sufficiently increase a voltage difference between a gate electrode and a source electrode of a buffer transistor without providing additional external terminals or internal elements, and can minimize the charge and discharge of internal capacitors.

An embodiment of the present disclosure may provide a scan driver, including a plurality of scan stages, wherein a first scan stage of the plurality of scan stages may include a first transistor including a gate electrode coupled to a first node, a first electrode coupled to a first power clock line, and a second electrode coupled to a first scan line; a first capacitor including a first electrode coupled to the first node, and a second electrode coupled to the first scan line; a second transistor including a gate electrode coupled to a second node, a first electrode coupled to the first scan line, and a second electrode coupled to a first power line; a third transistor including a gate electrode coupled to the second node, a first electrode coupled to a third node, and a second electrode coupled to a first control clock line; and a second capacitor including a first electrode coupled to the second node, and a second electrode coupled to the third node.

In an embodiment, the first scan stage may further include a fourth transistor including a gate electrode coupled to the second control clock line, a first electrode coupled to the second node, and a second electrode coupled to the first power line.

In an embodiment, the first scan stage may further include a fifth transistor including a gate electrode coupled to the second control clock line, a first electrode coupled to a scan start line, and a second electrode coupled to a fourth node.

In an embodiment, the first scan stage may further include a sixth transistor including a gate electrode coupled to the fourth node, a first electrode coupled to the second node, and a second electrode coupled to the second control clock line.

In an embodiment, the first scan stage may further include a seventh transistor including a gate electrode coupled to the second node, a first electrode coupled to a second power line, and a second electrode coupled to a first carry line.

In an embodiment, the first scan stage may further include an eighth transistor including a gate electrode coupled to the fourth node, a first electrode coupled to the first carry line, and a second electrode coupled to a first control clock line.

In an embodiment, the first scan stage may further include a third capacitor including a first electrode coupled to the fourth node, and a second electrode coupled to the first carry line.

In an embodiment, the first scan stage may further include a ninth transistor including a gate electrode coupled to the first control clock line, a first electrode coupled to the first carry line, and a second electrode coupled to the first node.

In an embodiment, the first scan stage may further include a tenth transistor including a gate electrode coupled to the fourth node, a first electrode coupled to the first node, and a second electrode coupled to the first power line.

In an embodiment, the first scan stage may further include an eleventh transistor configured to couple the first electrode of the fourth transistor to the second node, and the eleventh transistor may include a gate electrode coupled to the first power line, a first electrode coupled to the first electrode of the fourth transistor, and a second electrode coupled to the second node.

In an embodiment, the first scan stage may further include a twelfth transistor configured to couple the second electrode of the fifth transistor to the fourth node, and the twelfth transistor may include a gate electrode coupled to the first power line, a first electrode coupled to the second electrode of the fifth transistor, and a second electrode coupled to the fourth node.

In an embodiment, the first scan stage may further include a thirteenth transistor configured to couple the second electrode of the ninth transistor to the first node, and the thirteenth transistor may include a gate electrode coupled to the first power line, a first electrode coupled to the second electrode of the ninth transistor, and a second electrode coupled to the first node.

In an embodiment, the plurality of scan stages may include a second scan stage coupled to a second power clock line, the first control clock line, the second control clock line, the first carry line, a second carry line, and a second scan line.

An embodiment of the present disclosure may provide a display device including a scan driver including a pixel unit driven in a first display mode during a first period, and driven in a second display mode during a second period having a same time interval as the first period; and a plurality of scan stages coupled through a plurality of scan lines to the pixel unit, wherein a first cycle in which the plurality of scan stages supplies turn-on level of scan signals during the first period may be shorter than a second cycle in which the plurality of scan stages supplies the turn-on level of scan signals during the second period, wherein a first scan stage of the plurality of scan stages may include a first transistor including a gate electrode coupled to a first node, a first electrode coupled to a first power clock line, and a second electrode coupled to a first scan line; a first capacitor including a first electrode coupled to the first node, and a second electrode coupled to the first scan line; a second transistor including a gate electrode coupled to a second node, a first electrode coupled to the first scan line, and a second electrode coupled to a first power line; a third transistor including a gate electrode coupled to the second node, a first electrode coupled to a third node, and a second electrode coupled to a first control clock line; and a second capacitor including a first electrode coupled to the second node, and a second electrode coupled to the third node.

In another embodiment, the first scan stage may further include a fourth transistor including a gate electrode coupled to the second control clock line, a first electrode coupled to the second node, and a second electrode coupled to the first power line; and a fifth transistor including a gate electrode coupled to the second control clock line, a first electrode coupled to a scan start line, and a second electrode coupled to a fourth node.

In another embodiment, the first scan stage may further include a sixth transistor including a gate electrode coupled to the fourth node, a first electrode coupled to the second node, and a second electrode coupled to the second control clock line; and a seventh transistor including a gate electrode coupled to the second node, a first electrode coupled to a second power line, and a second electrode coupled to a first carry line.

In another embodiment, the first scan stage may further include an eighth transistor including a gate electrode coupled to the fourth node, a first electrode coupled to the first carry line, and a second electrode coupled to a first control clock line; and a third capacitor including a first electrode coupled to the fourth node, and a second electrode coupled to the first carry line.

In another embodiment, the first scan stage may further include a ninth transistor including a gate electrode coupled to the first control clock line, a first electrode coupled to the first carry line, and a second electrode coupled to the first node; and a tenth transistor including a gate electrode coupled to the fourth node, a first electrode coupled to the first node, and a second electrode coupled to the first power line.

In another embodiment, the first scan stage may further include an eleventh transistor configured to couple the first electrode of the fourth transistor to the second node, and the eleventh transistor may include a gate electrode coupled to the first power line, a first electrode coupled to the first electrode of the fourth transistor, and a second electrode coupled to the second node.

In another embodiment, the first scan stage may further include a twelfth transistor configured to couple the second electrode of the fifth transistor to the fourth node; and a thirteenth transistor configured to couple the second electrode of the ninth transistor to the first node, and the twelfth transistor may include a gate electrode coupled to the first power line, a first electrode coupled to the second electrode of the fifth transistor, and a second electrode coupled to the fourth node, and the thirteenth transistor may include a gate electrode coupled to the first power line, a first electrode coupled to the second electrode of the ninth transistor, and a second electrode coupled to the first node.

DETAILED DESCRIPTION

Figure 1:
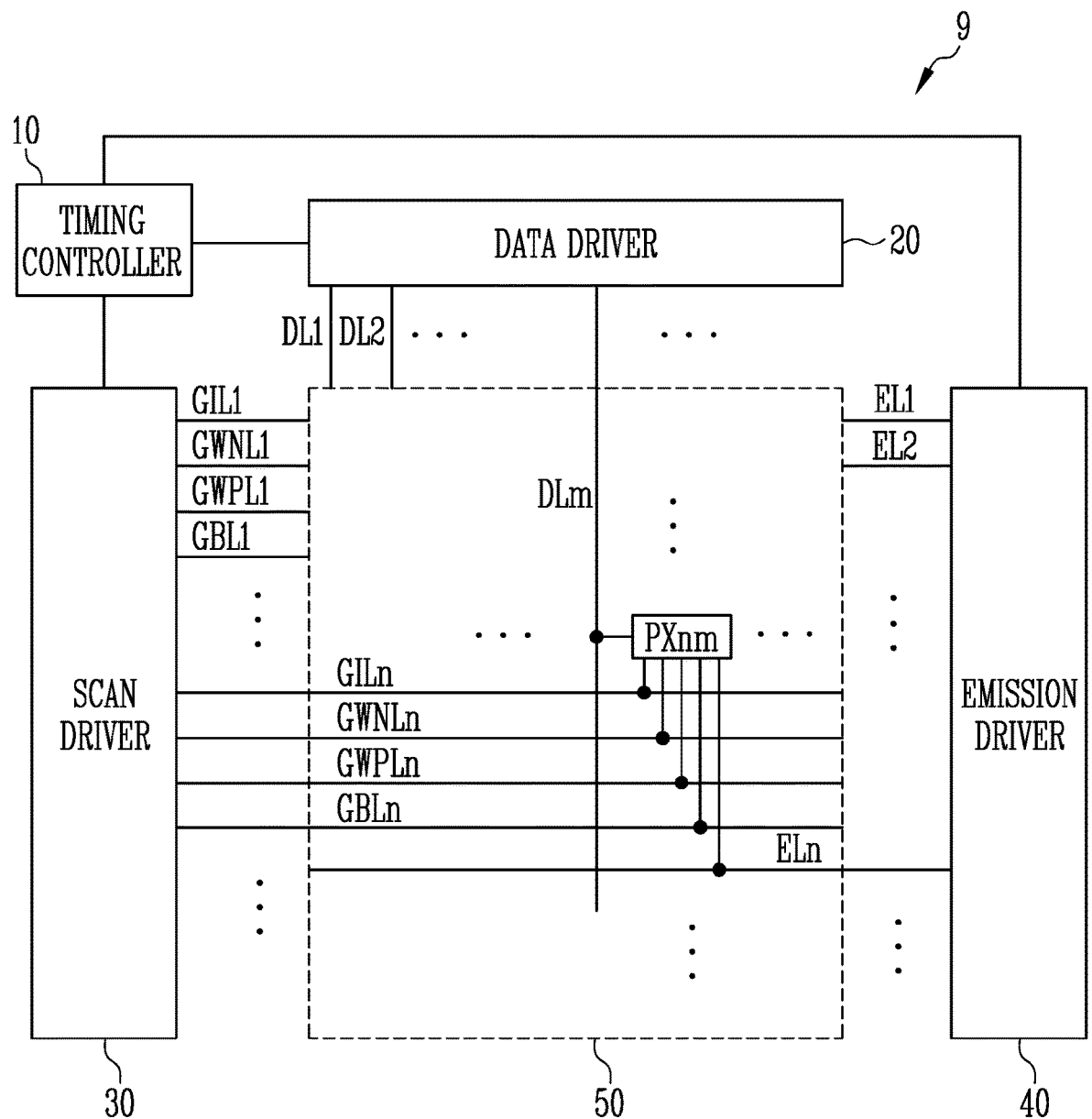
FIG. 1 is a diagram illustrating a display device in accordance with an embodiment of the present disclosure.

Hereinafter, embodiments of the present inventive concept will be described in detail with reference to the attached drawings, such that those skilled in the art can easily implement the present inventive concept. The present disclosure may be implemented in various forms, and is not limited to embodiments to be described herein below.

In the drawings, portions which are not related to the present disclosure will be omitted to explain the present disclosure more clearly. Reference should be made to the drawings, in which similar reference numerals are used throughout the different drawings to designate similar components. Therefore, the aforementioned reference numerals may be used in other drawings.

For reference, the size of each component and the thicknesses of lines illustrating the component are arbitrarily expressed for the sake of explanation, and the present disclosure is not limited to those illustrated in the drawings. In the drawings, the thicknesses of the components may be exaggerated to clearly express several layers and areas.

Hereinafter, the coupling of an electrode or line with another electrode or line not only means that the electrode or line is "directly" coupled to another electrode or line but also means that the electrode or line is "indirectly" coupled to another electrode or line via an intervening element.

FIG. 1 is a diagram illustrating a display device in accordance with an embodiment of the present disclosure.

Referring to FIG. 1, the display device 9 in accordance with an embodiment may include a timing controller 10, a data driver 20, a scan driver 30, an emission driver 40, and a pixel unit 50.

The timing controller 10 may receive an external input signal from an external processor. The external input signal may include a vertical synchronization signal, a horizontal synchronization signal, a data enable signal, an RGB data signal, etc.

The vertical synchronization signal may include a plurality of pulses, and may indicate a starting point of one frame. An interval between adjacent pulses of the vertical synchronization signal may correspond to one frame period. The horizontal synchronization signal may include a plurality of pulses, and may indicate a starting point of one horizontal period. An interval between adjacent pulses of the horizontal synchronization signal may correspond to one horizontal period. The data enable signal may have an enable level for specific horizontal periods, and may have a disable level in a remaining period. When the data enable signal is the enable level, this may indicate that the RGB data signal is supplied in corresponding horizontal periods. The RGB data signal may be simultaneously supplied to pixels in one pixel row during a corresponding horizontal period. The timing controller 10 may generate gray scale values in response to the RGB data signal to correspond to the specification of the display device 9. The timing controller 10 may generate control signals that are to be supplied to the data driver 20, the scan driver 30, and the emission driver 40 in response to the external input signal to correspond to the specification of the display device 9.

The data driver 20 may generate data voltages to be provided to data lines DL1, DL2, DLm using the gray scale values and the control signals that are received from the timing controller 10. For example, the data driver 20 may sample gray scale values using a clock signal, and may simultaneously supply data voltages corresponding to gray scale values of pixels in one pixel row to the data lines DL1, DL2, DLm (e.g. pixels coupled to the same scan line).

The scan driver 30 may receive a clock signal, a scan start signal, etc. from the timing controller 10, and generate scan signals to be provided to the scan lines GIL1 GWNL1, GWPL1, GBL1, . . . , GILn, GWNLn, GWPLn, GBLn. Here, n is an integer greater than 0.

The scan driver 30 may include a plurality of sub scan drivers. For example, a first sub scan driver may provide scan signals for scan lines GIL1 and GILn, a second sub scan driver may provide scan signals for scan lines GWNL1 and GWNLn, a third sub scan driver may provide scan signals for scan lines GWPL1 and GWPLn, and a fourth sub scan driver may provide scan signals for scan lines GBL1 and GBLn. Respective sub scan drivers may include a plurality of scan stages coupled in the form of a shift register. For example, scan signals may be generated in such a way as to sequentially transmit the turn-on level pulse of the scan start signal supplied to the scan start line to a next scan stage.

As another example, first and second sub scan drivers may be integrated to provide scan signals for the scan lines GILL GWNL1, GILn, and GWNLn, and third and fourth sub scan drivers may be integrated to provide scan signals for the scan lines GWPL1, GBL1, GWPLn, and GBLn. For example, a previous scan line (i.e. n−1-th scan line) of the n-th scan line GWNLn may be coupled to the same electric node as the n-th scan line GILn. Furthermore, for example, a next scan line (i.e. n+1-th scan line) of the n-th scan line GWPLn may be coupled to the same electric node as the n-th scan line GBLn.

In this case, the first and second sub scan drivers may supply scan signals having pulses of a first polarity to the scan lines GILL GWNL1, GILn, and GWNLn. Furthermore, the third and fourth sub scan drivers may supply scan signals having pulses of a second polarity to the scan lines GWPL1, GBL1, GWPLn, and GBLn. The first polarity and the second polarity may be opposite to each other.

Hereinafter, the polarity may mean the logic level of the pulse. For example, if the pulse has the first polarity, the pulse may have a logic high level. When the pulse having the logic high level is supplied to a gate electrode of an N-type transistor, the N-type transistor may be turned on. That is, the pulse having the logic high level may be the turn-on level for the N-type transistor. Here, it is assumed that a sufficiently low level of voltage is applied to the source electrode of the N-type transistor as compared to the gate electrode. For example, the N-type transistor may be NMOS.

Furthermore, if the pulse has the second polarity, the pulse may have a logic low level. When the pulse having the logic low level is supplied to a gate electrode of a P-type transistor, the P-type transistor may be turned on. That is, the pulse having the logic low level may be the turn-on level for the P-type transistor. Here, it is assumed that a sufficiently high level of voltage is applied to the source electrode of the P-type transistor as compared to the gate electrode. For example, the P-type transistor may be PMOS.

The emission driver 40 may receive a clock signal, an emission stop signal, etc. from the timing controller 10, and generate emission signals to be provided to the emission lines EL1, EL2, and ELn. For example, the emission driver 40 may sequentially provide emission signals having a turn-off level pulse to the emission lines EL1, EL2, and ELn. For example, the emission driver 40 may be made in the form of the shift register and may generate emission signals in such a way as to sequentially transmit the turn-off level pulse of the emission stop signal to a next emission stage under the control of the clock signal.

The pixel unit 50 includes pixels. For example, the pixel Pxnm may be coupled to a corresponding data line DLm, scan lines GILn, GWNLn, GWPLn, and GBLn, and an emission line ELn.

Figure 2:
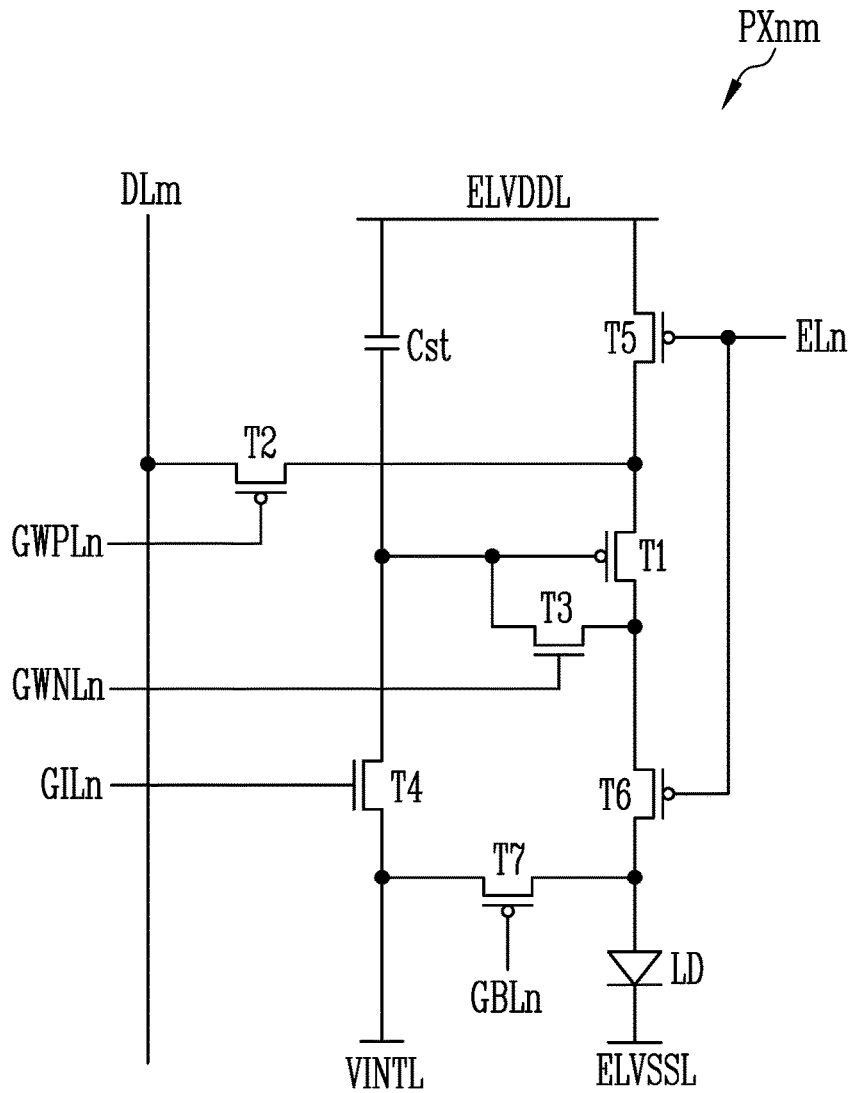
FIG. 2 is a diagram illustrating a pixel in accordance with an embodiment of the present disclosure.

FIG. 2 is a diagram illustrating a pixel in accordance with an embodiment of the present disclosure.

Referring to FIG. 2, the pixel PXnm according to an embodiment of the present disclosure includes transistors T1, T2, T3, T4, T5, T6, and T7, a storage capacitor Cst, and a light emitting diode LD.

A first electrode of the transistor T1 may be coupled to a first electrode of the transistor T2, a second electrode thereof may be coupled to a first electrode of the transistor T3, and a gate electrode may be coupled to a second electrode of the transistor T3. The transistor T1 may be referred to as a driving transistor.

A first electrode of the transistor T2 may be coupled to the first electrode of the transistor T1, a second electrode thereof may be coupled to the data line DLm, and a gate electrode may be coupled to the scan line GWPLn. The transistor T2 may be referred to as a scan transistor.

A first electrode of the transistor T3 may be coupled to the second electrode of the transistor T1, a second electrode thereof may be coupled to the gate electrode of the transistor T1, and a gate electrode may be coupled to the scan line GWNLn. The transistor T3 may be referred to as a diode coupling transistor.

A first electrode of the transistor T4 may be coupled to the second electrode of the capacitor Cst, a second electrode thereof may be coupled to an initialization line VINTL, and a gate electrode may be coupled to the scan line GILn. The transistor T4 may be referred to as a gate initialization transistor.

A first electrode of the transistor T5 may be coupled to a power line ELVDDL, a second electrode thereof may be coupled to the first electrode of the transistor T1, and a gate electrode may be coupled to the emission line ELn. The transistor T5 may be referred to as a first emission transistor.

A first electrode of the transistor T6 may be coupled to the second electrode of the transistor T1, a second electrode thereof may be coupled to an anode of the light emitting diode LD, and a gate electrode may be coupled to the emission line ELn. The transistor T6 may be referred to as a second emission transistor.

A first electrode of the transistor T7 may be coupled to the anode of the light emitting diode LD, a second electrode thereof may be coupled to the initialization line VINTL, and a gate electrode may be coupled to the scan line GBLn. The transistor T7 may be referred to as an anode initialization transistor.

A first electrode of the storage capacitor Cst may be coupled to the power line ELVDDL, and a second electrode thereof may be coupled to the gate electrode of the transistor T1.

An anode of the light emitting diode LD may be coupled to the second electrode of the transistor T6, and a cathode thereof may be coupled to a power line ELVSSL. The voltage applied to the power line ELVSSL may be set lower than the voltage applied to the power line ELVDDL. The light emitting diode LD may be an organic light emitting diode, an inorganic light emitting diode, a quantum dot light emitting diode, etc.

Each of the transistors T1, T2, T5, T6, and T7 may be formed of a P-type transistor. Channels of the transistors T1, T2, T5, T6, and T7 may be made of poly silicon. The poly silicon transistor may be a low temperature poly silicon (LTPS) transistor. The poly silicon transistor has a high electron mobility, and thus has fast driving characteristics.

Each of the transistors T3 and T4 may be formed of an N-type transistor. Channels of the transistors T3 and T4 may be made of an oxide semiconductor. An oxide semiconductor transistor may be produced through a low-temperature process, and have low charge mobility as compared to that of the poly-silicon. Therefore, a leakage current amount of the oxide semiconductor transistors generated in the turn-off state is smaller than that of the poly silicon transistors.

Alternatively, the transistor T7 may not be formed of poly silicon but may be formed of the N-type oxide semiconductor transistor. Here, one of the scan lines GWNLn and GILn in place of the scan line GBLn may be coupled to the gate electrode of the transistor T7 when the transistor T7 is formed of the N-type oxide semiconductor transistor.

Figure 3:
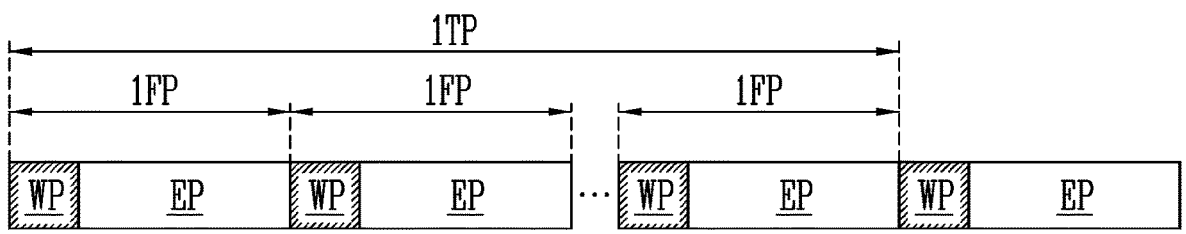
FIG. 3 is a diagram illustrating a high-frequency driving method in accordance with an embodiment of the present disclosure.

FIG. 3 is a diagram illustrating a high-frequency driving method in accordance with an embodiment of the present disclosure.

When the pixel unit 50 displays frames at the first driving frequency, the display device 9 may be expressed as being in the first display mode. Furthermore, when the pixel unit 50 displays frames at the second driving frequency that is smaller than the first driving frequency, the display device 9 may be expressed as being in the second display mode.

In the first display mode, the display device 9 may display image frames at 20 Hz or more, for example, 60 Hz.

The second display mode may be a low-power display mode. The display device may display image frames at a frequency less than 20 Hz, for example, 1 Hz. For example, a case where only time and date are displayed in an "always on mode" in a utility mode may correspond to a second display mode.

A period 1TP may include a plurality of frame periods 1FP. The period 1TP is a period that is arbitrarily defined to compare the first display mode with the second display mode. The period 1TP may mean the same time interval in the first display mode and the second display mode. For the convenience of description, it is assumed that the frame period 1FP has the same time intervals in the first display mode and the second display mode. Therefore, the period 1TP may include the same number of frame periods 1FP in the first display mode and the second display mode.

In the first display mode, each of the frame periods 1FP may include a data writing period WP and an emission period EP. For the convenience of description, FIG. 3 shows that the data writing period WP is positioned at the beginning of the frame period 1FP and the emission period EP is positioned after the data writing period WP in a first pixel row. However, in rows other than the first pixel row, the data writing period WP may be located in the middle or end of the frame period 1FP.

Therefore, the pixels PX11 to PXnm may display a plurality of image frames corresponding to the number of frame periods 1FP during the period 1TP based on data voltages received in data writing periods WP.

Figure 4:
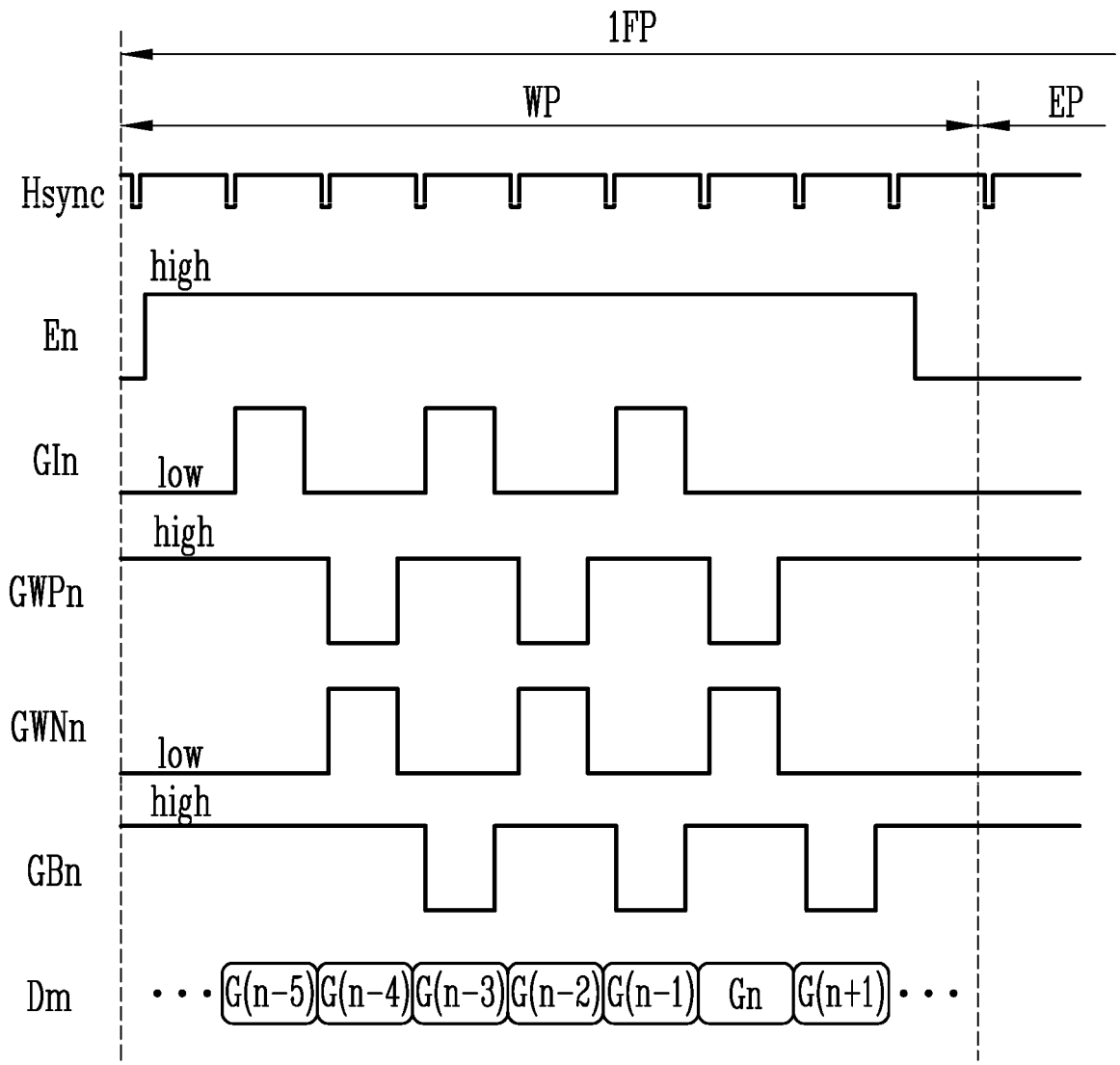
FIG. 4 is a diagram illustrating a data writing period in accordance with an embodiment of the present disclosure.
Figure 5:
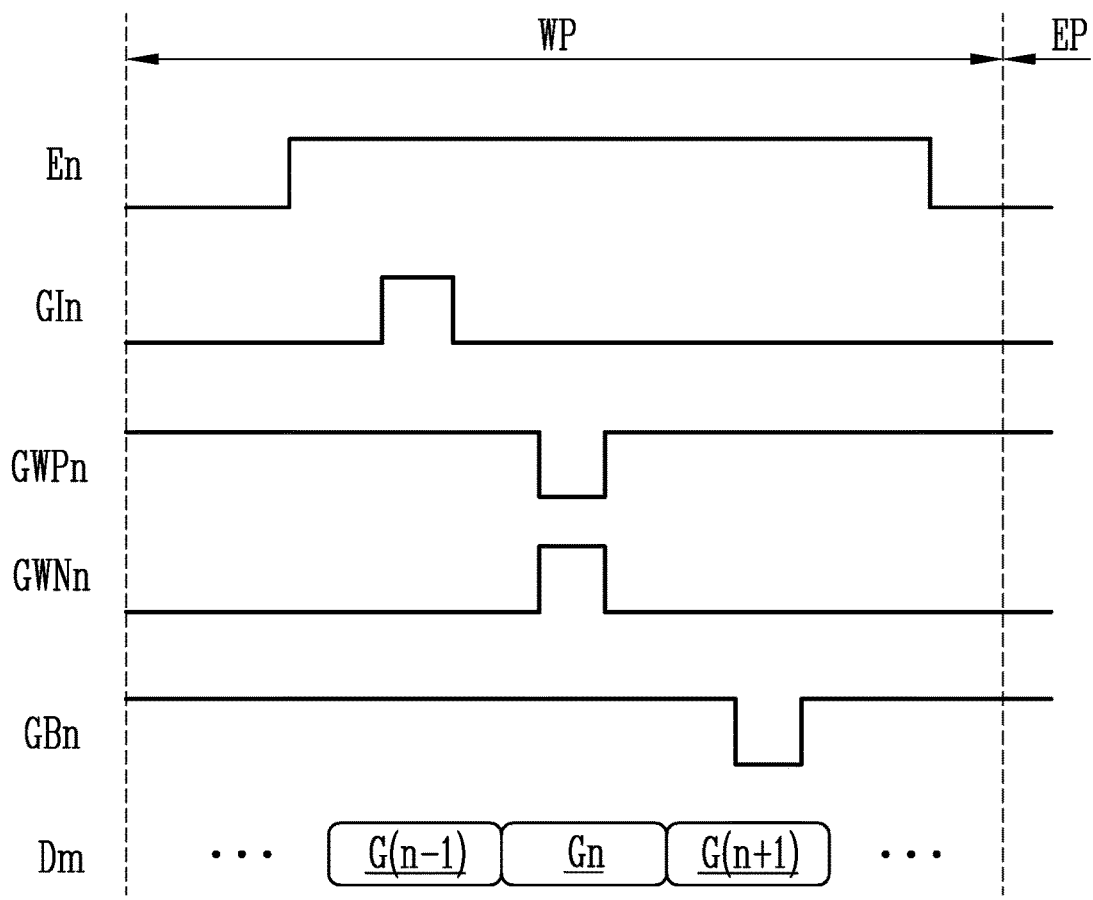
FIG. 5 is a diagram illustrating a data writing period in accordance with another embodiment of the present disclosure.

FIG. 4 is a diagram illustrating a data writing period in accordance with an embodiment of the present disclosure. FIG. 5 is a diagram illustrating a data writing period in accordance with another embodiment of the present disclosure.

First, an emission signal En of a turn-off level (high level) may be supplied to the emission line ELn during the data writing period WP. Therefore, the transistors T5 and T6 may be in the turn-off state during the data writing period WP.

First, a first pulse of a turn-on level (high level) is supplied to the scan line GILn. Thus, the transistor T4 is turned on, and the initialization line VINTL is connected to the gate electrode of the transistor T1. Thus, the voltage of the gate electrode of the transistor T1 is initialized to the initialization voltage which is provided from the initialization line VINTL and is maintained by the storage capacitor Cst. For example, the initialization voltage of the initialization line VINTL may be sufficiently lower than the voltage of the power line ELVDDL. For example, the initialization voltage may be a voltage of the same or similar level as that of the power line ELVSSL. Therefore, the transistor T1 may be turned on.

Next, first pulses of the turn-on level are supplied to the scan lines GWPLn and GWNLn, respectively, and corresponding transistors T2 and T3 are turned on. Thus, the data voltage Dm applied to the data line DLm is written in the storage capacitor Cst through the transistors T2, T1, and T3. At this time, the data voltage Dm corresponds to a gray scale value G(n−4) of the pixel before 4 horizontal periods is written in the storage capacitor Cst to apply on-bias voltage to the transistor T1. If the on-bias voltage is applied to the transistor T1 before an intended data voltage Dm is written, a hysteresis phenomenon may be improved.

Next, the first pulse of the turn-on level (low level) is supplied to the scan line GBLn, and the transistor T7 is turned on. Therefore, the anode voltage of the light emitting diode LD is initialized.

In this case, the second pulse of the turn-on level (high level) is supplied to the scan line GILn, and the above-described driving process is performed again. That is, the on-bias voltage is applied to the transistor T1 once again, and the anode voltage of the light emitting diode LD is initialized.

If the third pulses of the turn-on level are supplied to the scan lines GWPn and GWNn by repeating the above-described process, the data voltage Dm corresponding to the gray scale value Gn of the pixel PXnm is written in the storage capacitor Cst. At this time, the data voltage Dm written in the storage capacitor Cst is a data voltage in which threshold voltage of the transistor T1 is compensated.

Finally, if the emission signal En is changed to the turn-on level (low level), the transistors T5 and T6 are turned on. Thus, a driving current path coupled to the power line ELVDDL, the transistors T5, T1, and T6, the light emitting diode LD, and the power line ELVSSL is formed, so that a driving current flows through the path. The driving current amount corresponds to the data voltage Dm stored in the storage capacitor Cst. Because the threshold voltage compensated data voltage is stored in the storage capacitor Cst, the driving current corresponding to the data voltage Dm may flow regardless of the threshold voltage value of the transistor T1.

The light emitting diode LD emits light at a desired luminance according to the driving current amount.

According to this embodiment, each scan signal includes three pulses. However, according to another embodiment, each scan signal may include two pulses or four or more pulses. In a further embodiment, each scan signal may be formed to include one pulse. In this case, a process of applying the on-bias voltage to the transistor T1 is omitted (see FIG. 5).

Furthermore, an interval between adjacent pulses of the horizontal synchronization signal Hsync may correspond to one horizontal period. Although it is shown in FIG. 4 that the pulse of the horizontal synchronization signal Hsync is at the low level, the pulse may be at the high level according to another embodiment.

Figure 6:
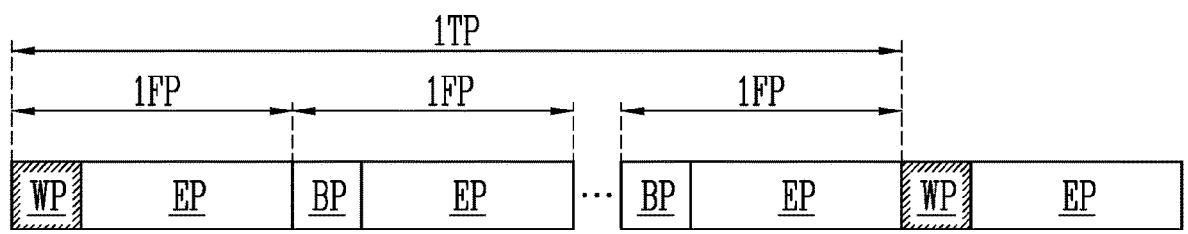
FIG. 6 is a diagram illustrating a low-frequency driving method in accordance with an embodiment of the present disclosure.

FIG. 6 is a diagram illustrating a low-frequency driving method in accordance with an embodiment of the present disclosure.

In the second display mode, a first frame period 1FP of the period 1TP includes a data writing period WP and an emission period EP, and remaining frame periods 1FP of the period 1TP include a bias refresh period (BP) and an emission period EP.

Since the transistors T3 and T4 of the pixel PXnm maintain the turn-off state in the remaining frame periods 1FP of the period 1TP, the storage capacitor Cst maintain the same data voltage during a plurality of image frames. Particularly, since the transistors T3 and T4 may be composed of oxide semiconductor transistors, a leakage current may be minimized.

Therefore, the pixel PXnm may display the same single image frame during the period 1TP based on the data voltage supplied during the data writing period WP.

Figure 7:
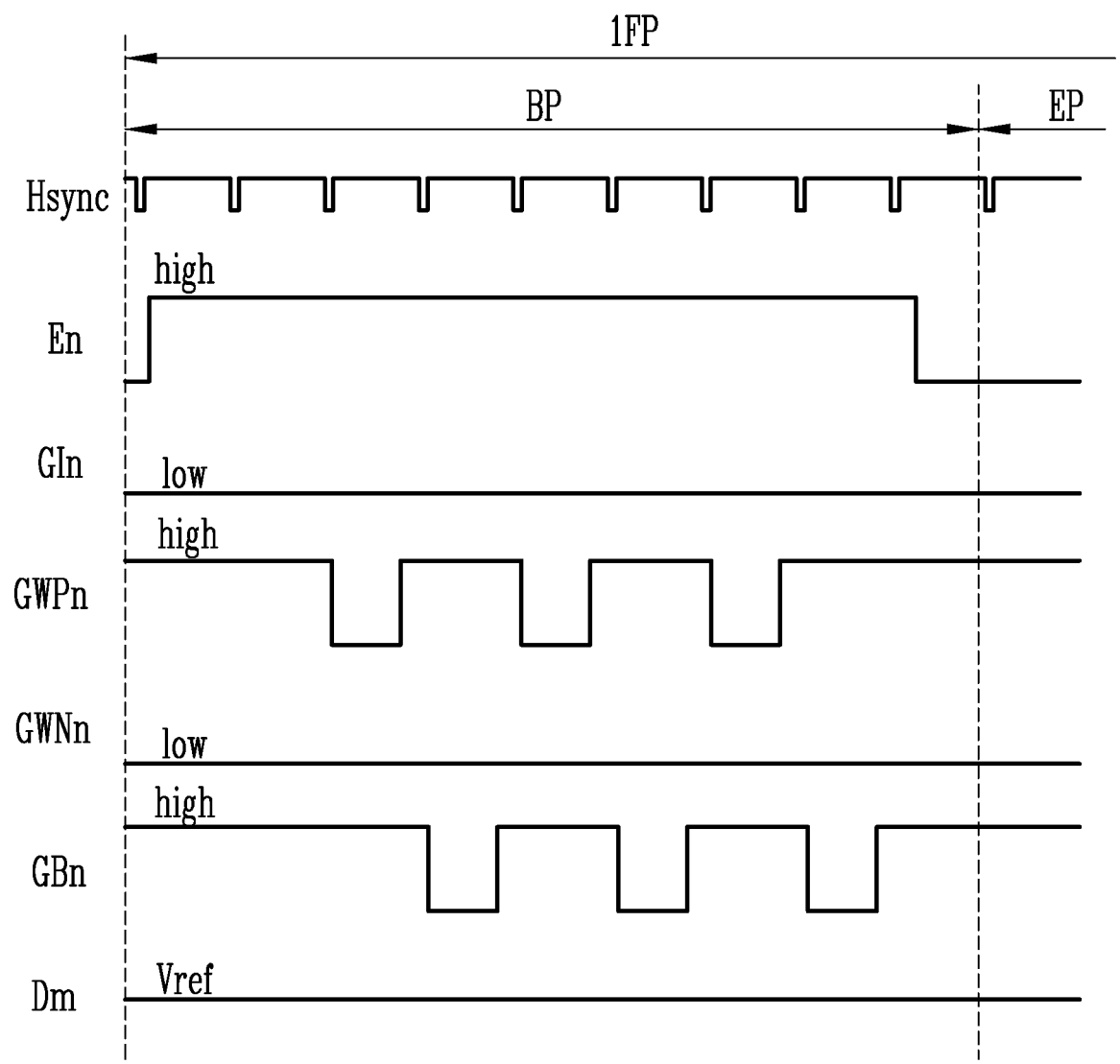
FIG. 7 is a diagram illustrating a bias refresh period in accordance with an embodiment of the present disclosure.

FIG. 7 is a diagram illustrating a bias refresh period in accordance with an embodiment of the present disclosure.

Figure 8:
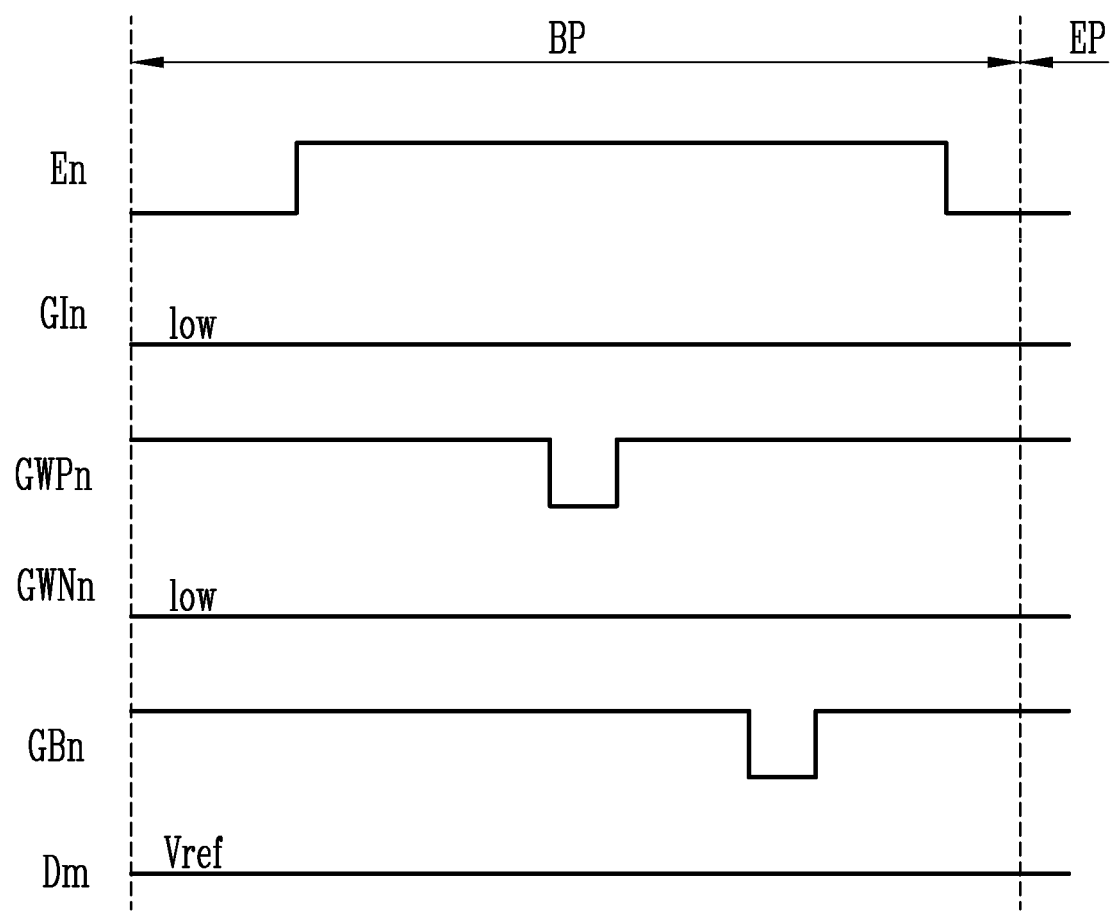
FIG. 8 is a diagram illustrating a bias refresh period in accordance with another embodiment of the present disclosure.

FIG. 8 is a diagram illustrating a bias refresh period in accordance with another embodiment of the present disclosure.

Referring to FIG. 7, in the bias refresh period BP, the scan signals GIn and GWNn of the turn-off level (low level) are supplied. Therefore, as described above, in the bias refresh period BP, the data voltage written in the storage capacitor Cst is not changed. In this case, a reference data voltage Vref may be applied to the data line DLm.

In the bias refresh period BP, the emission signal EN and the scan signals GWPn and GBn having the same waveform as the data writing period WP may be supplied. Therefore, by making the output light waveform of the light emitting diode LD similar in the plurality of frame periods 1FP of the period 1TP, flicker may not be recognized by a user during low-frequency driving.

The pixel PXnm described with reference to FIGS. 1 to 7 is one embodiment suitable for high-frequency driving and low-frequency driving. Embodiments that will be described later may be applied to a pixel having other circuits capable of driving high frequency and low frequency. For example, all the transistors T1 to T7 of the pixel PXnm may be composed of only P-type transistors. In this case, since the scan driver 30 has only to include a sub scan driver for the P-type transistors, the configuration of the scan driver 30 may be simplified. For example, the transistors of the pixel PXnm may not include light emitting transistors T5 and T6. In this case, the emission driver 40 may be unnecessary.

According to this embodiment, each scan signal GWPn or GBn includes three pulses. However, according to another embodiment, each scan signal GWPn or GBn may include two pulses or four or more pulses. In a further embodiment, each scan signal GWPn or GBn may be formed to include only one pulse. In this case, a process of applying the on-bias voltage to the transistor T1 is omitted (see FIG. 8).

A period 1TP when the pixel unit 50 is driven in the first display mode may be referred to as a first period (see FIG. 3). A period 1TP when the pixel unit 50 is driven in the second display mode may be referred to as a second period (see FIG. 6). In this regard, the time intervals of the first and second periods may be equal to each other. That is, the first and second periods may include the same number of frame periods 1FP.

A plurality of scan stages may supply the scan signals of the turn-on level in a first cycle for a first period. For example, referring to FIGS. 3 and 5, the scan signals of the turn-on level may be supplied to be proportional to the number of data writing periods WP in the first period. A plurality of scan stages may supply the scan signals of the turn-on level in a second cycle for a second period. For example, referring to FIGS. 6 and 8, the scan signals of the turn-on level may be supplied to be proportional to the number of data writing periods WP in the second period. The number of the data writing period WP included in the second period is smaller than the number of the data writing period WP included in the first period. Therefore, it can be expressed that the first cycle is shorter than the second cycle.

Figure 9:
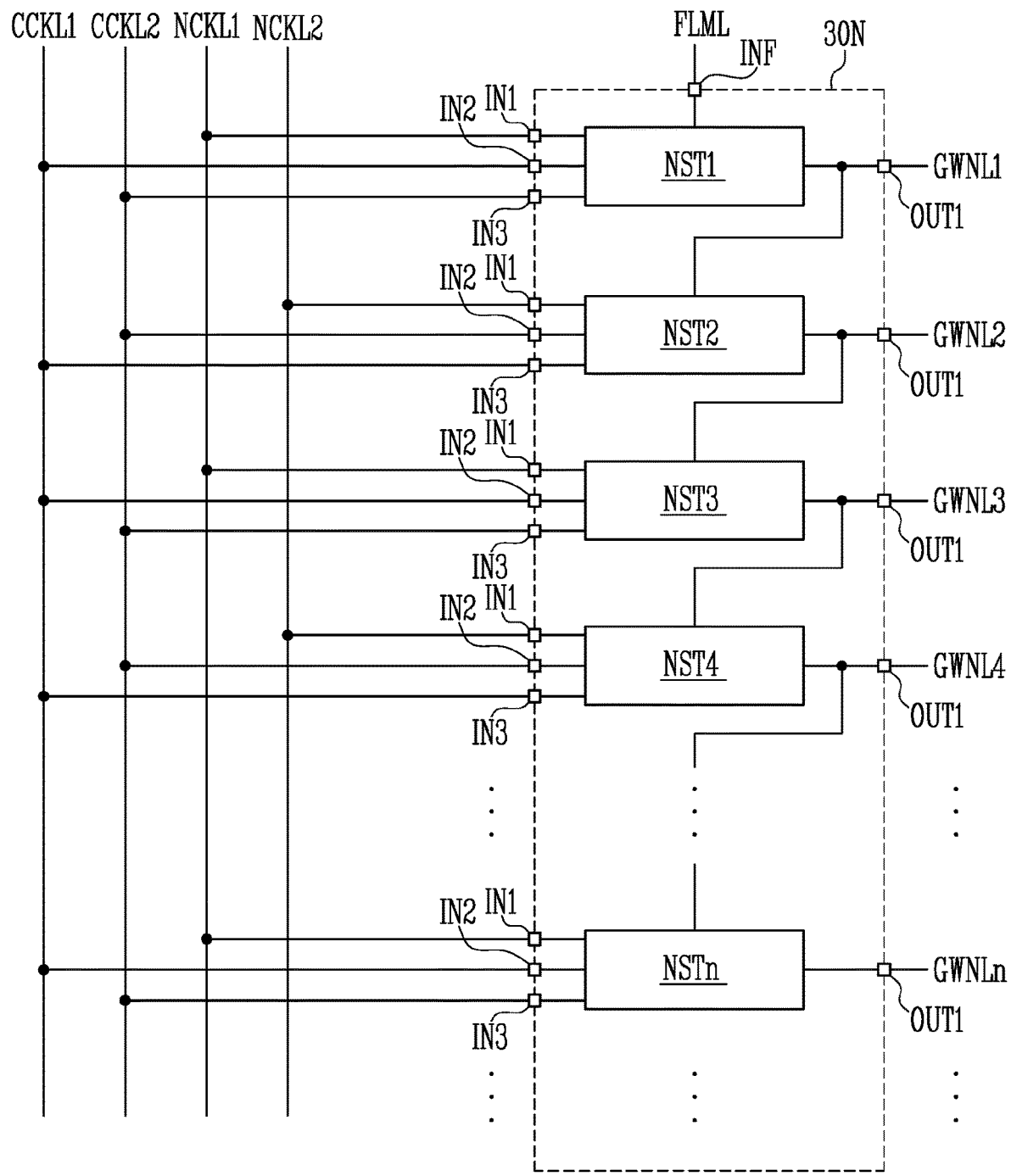
FIG. 9 is a diagram illustrating a scan driver in accordance with an embodiment of the present disclosure.

FIG. 9 is a diagram illustrating a scan driver in accordance with an embodiment of the present disclosure.

Referring to FIG. 9, an exemplary structure of the scan driver 30N including a plurality of scan stages NST1, NST2, NST3, NST4, and NSTn is illustrated.

The scan driver 30N may correspond to the second sub scan driver of the scan driver 30 described with reference to FIG. 1. According to an embodiment, when the transistors receiving the scan signal among the transistors of the pixel are composed of only the N-type transistors, the pixel may be operated only by the scan driver 30N. Therefore, the scan driver 30N may not be a sub scan driver but may be an independent scan driver.

The scan driver 30N may include a scan start input terminal INF, first input terminals IN1, second input terminals IN2, third input terminals IN3, and first output terminals OUT1. The scan driver 30 may further include power input terminals, which are omitted in FIG. 9.

Each of the scan stages NST1 to NSTn may include a first input terminal IN1, a second input terminal IN2, a third input terminal IN3, and a first output terminal OUT1. The first scan stage NST1 may further include the scan start input terminal INF. The first scan stage NST1 may be coupled to a scan start line FLML through the scan start input terminal INF.

Each of the scan stages NST1 to NSTn may be coupled through the first input terminal IN1 thereof to a first power clock line NCKL1 or a second power clock line NCKL2. Adjacent scan stages among the scan stages NST1 to NSTn may be coupled to different power clock lines NCKL1 and NCKL2. For example, the second scan stage NST2 may be coupled to the second power clock line NCKL2, and the first and third scan stages NST1 and NST3 that are adjacent to the second scan stage NST2 may be coupled to the first power clock line NCKL1. The first and second power clock lines NCKL1 and NCKL2 may be alternately coupled to the scan stages NST1 to NSTn. For example, the first power clock line NCKL1 may be coupled to odd-numbered scan stages NST1, NST3, and NSTn, and the second power clock line NCKL2 may be coupled to even-numbered scan stages NST2 and NST4. In contrast, the second power clock line NCKL2 may be coupled to the odd-numbered scan stages NST1, NST3, and NSTn, and the first power clock line NCKL1 may be coupled to the even-numbered scan stages NST2 and NST4.

Each of the scan stages NST1 to NSTn may be coupled through the second input terminal IN2 thereof to a first control clock line CCKL1 or a second control clock line CCKL2. The adjacent scan stages among the scan stages NST1 to NSTn may be coupled through the second input terminals IN2 to different control clock lines CCKL1 and CCKL2. For example, the second scan stage NST2 may be coupled through the second input terminal IN2 to the second control clock line CCKL2, and the first and third scan stages NST1 and NST3 that are adjacent to the second scan stage NST2 may be coupled through the second input terminal IN2 to the first control clock line CCKL1. The first and second control clock lines CCKL1 and CCKL2 may be alternately coupled through the second input terminals IN2 to the scan stages NST1 to NSTn. For example, the odd-numbered scan stages NST1, NST3, and NSTn may be coupled through the second input terminals IN2 to the first control clock line CCKL1, and the even-numbered scan stages NST2 and NST4 may be coupled through the second input terminals IN2 to the second control clock line CCKL2. In contrast, the odd-numbered scan stages NST1, NST3, and NSTn may be coupled through the second input terminals IN2 to the second control clock line CCKL2, and the even-numbered scan stages NST2 and NST4 may be coupled through the second input terminals IN2 to the first control clock line CCKL1.

Each of the scan stages NST1 to NSTn may be coupled through the third input terminal IN3 thereof to the second control clock line CCKL2 or the first control clock line CCKL1. The control clock line connected through the third input terminal IN3 in each of the scan stages NST1 to NSTn may be different from the control clock line connected through the second input terminal IN2.

The scan stages NST1 to NSTn may be coupled through the first output terminals OUT1 to the scan lines GWNL1, GWNL2, GWNL3, GWNL4, and GWNLn. Each of the scan stages NST2, NST3, NST4, and NSTn excluding the first scan stage NST1 may be coupled to the scan line of a previous scan stage.

In order to reduce a clock frequency or implement other driving methods, the numbers of the power clock lines NCKL1 and NCKL2 and the control clock lines CCKL1 and CCKL2 may be changed.

Figure 10:
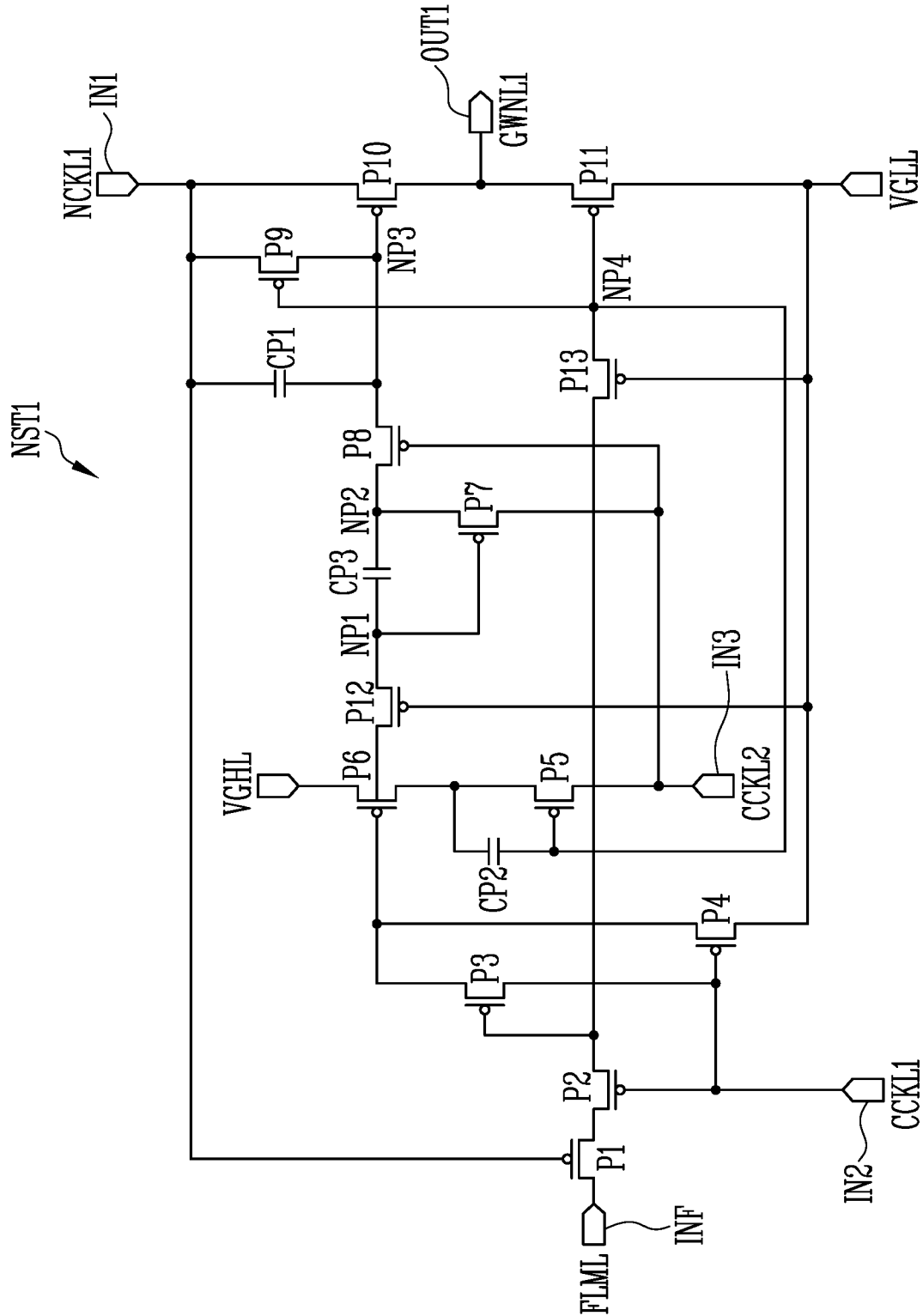
FIG. 10 is a diagram illustrating a scan stage included in the scan driver of FIG. 9.

FIG. 10 is a diagram illustrating a scan stage included in the scan driver of FIG. 9.

Referring to FIG. 10, the first scan stage NST1 of the scan driver 30N of FIG. 9 is illustrated by way of example. Since other scan stages NST2, NST3, NST4, and NSTn of FIG. 9 have the substantially same configuration as the first scan stage NST1 except that the scan line of the previous scan stage is coupled to the second electrode of the transistor P1, a duplicated description will be omitted herein. The clock lines coupled to the first to third input terminals IN1, IN2, and IN3 refer to the description of FIG. 9.

The first scan stage NST1 may include transistors P1 to P13, and capacitors CP1 to CP3. The transistors P1 to P13 may be of the P-type transistors.

A first electrode of the transistor P1 may be coupled to a second electrode of the transistor P2, a second electrode of the transistor P1 may be coupled to a scan start line FLML, and a gate electrode of the transistor P1 may be coupled to the first power clock line NCKL1.

A first electrode of the transistor P2 may be coupled to a second electrode of the transistor P13, a second electrode of the transistor P2 may be coupled to the first electrode of the transistor P1, and a gate electrode of the transistor P2 may be coupled to the first control clock line CCKL1.

A first electrode of the transistor P3 may be coupled to a gate electrode of the transistor P6, a second electrode of the transistor P3 may be coupled to the first control clock line CCKL1, and a gate electrode of the transistor P3 may be coupled to the first electrode of the transistor P2.

A first electrode of the transistor P4 may be coupled to the gate electrode of the transistor P6, a second electrode of the transistor P4 may be coupled to a first power line VGLL which has a turn-on level, and a gate electrode of the transistor P4 may be coupled to the first control clock line CCKL1.

A first electrode of the transistor P5 may be coupled to a second electrode of the transistor P6, a second electrode of the transistor P5 may be coupled to the second control clock line CCKL2, and a gate electrode of the transistor P5 may be coupled to a node NP4.

A first electrode of the transistor P6 may be coupled to a second power line VGHL, a second electrode of the transistor P6 may be coupled to the first electrode of the transistor P5, and a gate electrode may be coupled to the node NP4.

A first electrode of the transistor P7 may be coupled to a node NP2, a second electrode thereof may be coupled to the second control clock line CCKL2, and a gate electrode may be coupled to a node NP1.

A first electrode of the transistor P8 may be coupled to a node NP3, a second electrode of the transistor P8 may be coupled to a node NP2, and a gate electrode of the transistor P8 may be coupled to the second control clock line CCKL2.

A first electrode of the transistor P9 may be coupled to the first power clock line NCKL1, a second electrode of the transistor P9 may be coupled to a node NP3, and a gate electrode of the transistor P9 may be coupled to the node NP4.

A first electrode of the transistor P10 may be coupled to the first power clock line NCKL1, a second electrode of the transistor P10 may be coupled to the first scan line GWNL1, and a gate electrode may be coupled to the node NP3.

A first electrode of the transistor P11 may be coupled to the scan line GWNL1, a second electrode of the transistor P11 may be coupled to the first power line VGLL, and a gate electrode of the transistor P11 may be coupled to the node NP4.

A first electrode of the transistor P12 may be coupled to the node NP1, a second electrode of the transistor P12 may be coupled to the gate electrode of the transistor P6, and a gate electrode of the transistor P12 may be coupled to the first power line VGLL.

A first electrode of the transistor P13 may be coupled to the node NP4, a second electrode of the transistor P13 may be coupled to the first electrode of the transistor P2, and a gate electrode of the transistor P13 may be coupled to the first power line VGLL.

A first electrode of the capacitor CP1 may be coupled to the first power clock line NCKL1, and a second electrode of the capacitor CP1 may be coupled to the node NP3.

A first electrode of the capacitor CP2 may be coupled to the first electrode of the transistor P5, and a second electrode of the capacitor CP2 may be coupled to the node NP4.

A first electrode of the capacitor CP3 may be coupled to the node NP2, and a second electrode of the capacitor CP2 may be coupled to the node NP1.

Figure 11:
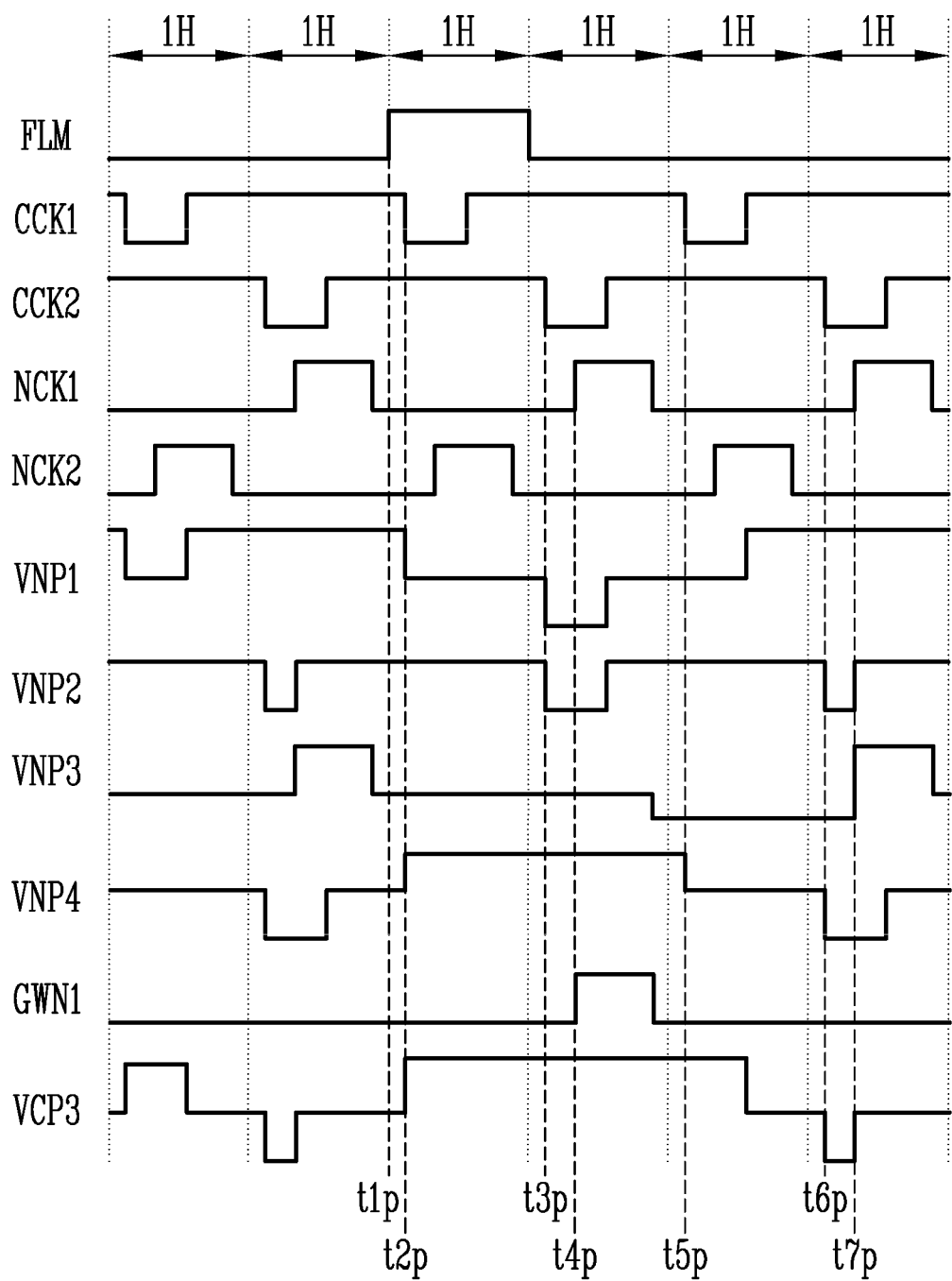
FIG. 11 is a diagram illustrating a method of driving the scan stage of FIG. 10.

FIG. 11 is a diagram illustrating a method of driving the scan stage of FIG. 10.

FIG. 11 illustrates a timing diagram for a scan start signal FLM applied to a scan start line FLML, a first control clock signal CCK1 applied to a first control clock line CCKL1, a second control clock signal CCK2 applied to a second control clock line CCKL2, a first power clock signal NCK1 applied to a first power clock line NCKL1, a second power clock signal NCK2 applied to a second power clock line NCKL2, a node voltage VNP1 of a node NP1, a node voltage VNP2 of a node NP2, a node voltage VNP3 of a node NP3, a node voltage VNP4 of a node NP4, and a first scan signal GWN1 applied to a first scan line GWNL1. An interval between pulses of a horizontal synchronization signal may be referred to as one horizontal period 1H. A voltage VCP3 is a voltage difference between the first electrode and the second electrode of the capacitor CP3.

A high-level voltage may be applied to the second power line VGHL, and a low-level voltage may be applied to the first power line VGLL. Since the transistors P12 and P13 having the gate electrodes coupled to the first power line VGLL are turned on for most of the period when describing the driving method, the description of the transistors P12 and P13 will be omitted except for specific cases.

First, at a time point t1p, a scan start signal FLM of the turn-off level (high level) is supplied. At this time, since the transistor P1 is turned on by the first power clock signal NCK1 of the low level, the scan start signal FLM of the high level is supplied to the second electrode of the transistor P2.

At a time point t2p, a first control clock signal CCK1 of the low level is supplied. Therefore, the transistors P2 and P4 are turned on.

If the transistor P2 is turned on, the scan start signal FLM of the high level is transmitted to the node NP4 through the transistor P13 which is turned on too, and the node voltage VNP4 becomes the high level. The transistors P3, P5, P9, and P11 are turned off by the node voltage VNP4 of the high level.

If the transistor P4 is turned on, the gate electrode of the transistor P6 is coupled to the first power line VGLL which has a turn-on level. Since the transistor P12 is turned on for most of time, the node voltage VNP1 drops to a voltage supplied by the first power line VGLL. Therefore, the transistors P6 and P7 are turned on.

If the transistor P6 is turned on, the first electrode of the capacitor CP2 is coupled to the second power line VGHL which has a high-level voltage. Therefore, the node voltage VNP4 of the node NP4 may be kept stable by the coupling of the capacitor CP2.

If the transistor P7 is turned on, the node NP2 is coupled to the second control clock line CCKL2. At this time, since the second control clock signal CCK2 of the high level is applied to the gate electrode of the transistor P8 and thereby the transistor P8 is turned off, the node voltage VNP3 is not changed.

At a time point t3p, a second control clock signal CCK2 of the low level is supplied.

The second control clock signal CCK2 of the low level is supplied through the transistor P7 to the node NP2. In this case, the node voltage VNP1 drops to be lower than the low level by the coupling of the capacitor CP3. Therefore, the transistor P7 can stably maintain the turn-on state and simultaneously have improved driving characteristics.

Such a drop of the node voltage VNP1 does not significantly affect the voltage of the first electrode of the transistor P3. Since the low-level voltage is applied to the gate electrode of the transistor P12, the voltage of the second electrode (source electrode) of the transistor P12 is prevented from being lower than the sum of the low level and the absolute value of the threshold value of the transistor P12. Therefore, it is possible to prevent a source-drain voltage difference of the turned-off transistor P3 from being excessively increased, thus prolonging the life of the transistor P3.

Furthermore, the transistor P8 is turned on by the second control clock signal CCK2 of the low level. Therefore, the node NP3 is coupled to the node NP2. The transistor P10 is turned on by the node voltage VNP3 of the low level. For reference, at this time, the transistor P9 is kept turned off by the node voltage VNP4 of the high level.

At a time point top, a first power clock signal NCK1 of the high level is supplied. Thus, the first power clock signal NCK1 of the high level is supplied turned on to the first scan line GWNL1 as the first scan signal GWN1 of the high level through the turned on transistor P10.

At a time point t5p, the first control clock signal CCK1 of the low level is supplied. At this time, since the first power clock signal NCK1 of the low level is supplied, the transistors P1 and P2 are turned on. Furthermore, since the scan start signal FLM of the low level is supplied, the node voltage VNP4 drops to the low level. Thus, the transistor P9 is turned on, and the transistor P10 is diode-coupled.

At a time point t6p, the second control clock signal CCK2 of the low level is supplied. Therefore, the transistor P8 is turned on, so that the node voltage VNP2 drops along the node voltage VNP3. Furthermore, the node voltage VNP4 drops to a voltage lower than the low level due to the coupling of the transistor P5 with the capacitor CP2. Thus, the low-level voltage of the first power line VGLL may be transmitted to the first scan line GWNL1 without being limited by the threshold voltage of the transistor P11.

At a time point t7p, the first power clock signal NCK1 of the high level is supplied. At this time, since the transistor P9 is turned on by the node voltage VNP4, the node voltage VNP3 rises to the high level. In this case, the node voltage VNP2 also rises to the high level through the turned on transistor P8. Since the transistor P10 is diode-coupled, the first power clock signal NCK1 of the high level is not transmitted to the first scan line GWNL1.

Figure 12:
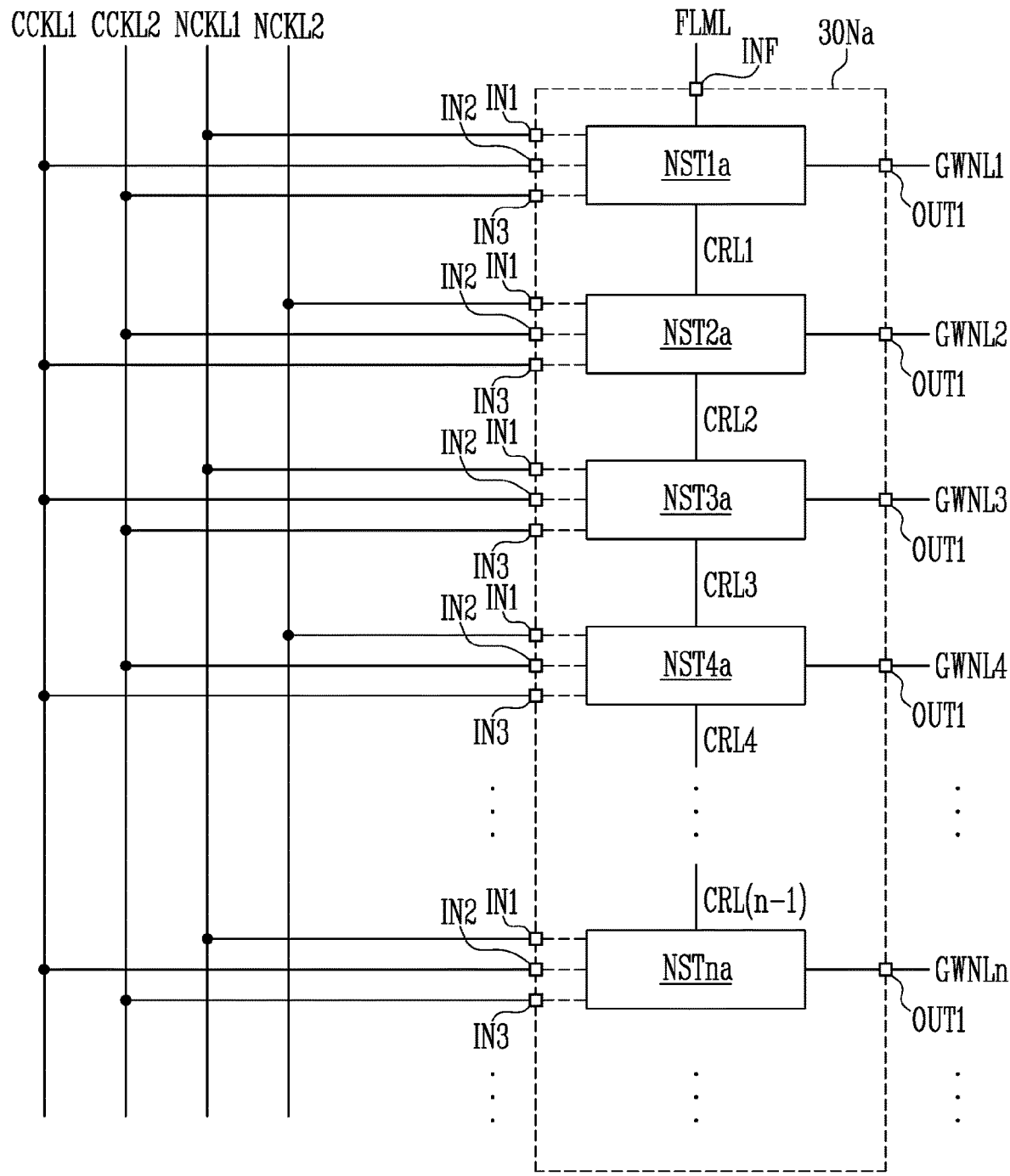
FIG. 12 is a diagram illustrating a scan driver in accordance with another embodiment of the present disclosure.

FIG. 12 is a diagram illustrating a scan driver in accordance with another embodiment of the present disclosure.

Referring to FIG. 12, an exemplary structure of the scan driver 30Na including a plurality of scan stages NST1a, NST2a, NST3a, NST4a, and NSTna is illustrated.

The scan driver 30Na may correspond to the second sub scan driver of the scan driver 30 described with reference to FIG. 1. According to an embodiment, when the transistors receiving the scan signal among the transistors of the pixel are composed of only the N-type transistors, the pixel may be operated only by the scan driver 30Na. Therefore, the scan driver 30Na may not be a sub scan driver but may be an independent scan driver.

The scan driver 30Na may include a scan start input terminal INF, first input terminals IN1, second input terminals IN2, third input terminals IN3, and first output terminals OUT1. The scan driver 30Na may further include power input terminals which are omitted in FIG. 12.

Each of the scan stages NST1a to NSTna may include a first input terminal IN1, a second input terminal IN2, a third input terminal IN3, and a first output terminal OUT1. The first scan stage NST1a may further include the scan start input terminal INF. The first scan stage NST1a may be coupled to a scan start line FLML through the scan start input terminal INF. The second scan stage NST2a may be coupled to a second power clock line NCKL2, a first control clock line CCKL1, a second control clock line CCKL2, a first carry line CRL1, a second carry line CRL2, and a second scan line GWNL2.

Each of the scan stages NST1a to NSTna may be coupled through the first input terminal IN1 thereof to the first power clock line NCKL1 or the second power clock line NCKL2. The adjacent scan stages among the scan stages NST1a to NSTna may be coupled to different power clock lines NCKL1 and NCKL2. For example, the second scan stage NST2a may be coupled to the second power clock line NCKL2, and the first and third scan stages NST1a and NST3a that are adjacent to the second scan stage NST2a may be coupled to the first power clock line NCKL1. The first and second power clock lines NCKL1 and NCKL2 may be alternately coupled to the scan stages NST1a to NSTna. For example, the first power clock line NCKL1 may be coupled to odd-numbered scan stages NST1a, NST3a, and NSTna, and the second power clock line NCKL2 may be coupled to even-numbered scan stages NST2a and NST4a. In contrast, the second power clock line NCKL2 may be coupled to the odd-numbered scan stages NST1a, NST3a, and NSTna, and the first power clock line NCKL1 may be coupled to the even-numbered scan stages NST2a and NST4a.

Each of the scan stages NST1a to NSTna may be coupled through the second input terminal IN2 thereof to the first control clock line CCKL1 or the second control clock line CCKL2. The adjacent scan stages among the scan stages NST1a to NSTna may be coupled through the second input terminals IN2 to different control clock lines CCKL1 and CCKL2. For example, the second scan stage NST2a may be coupled through the second input terminal IN2 to the second control clock line CCKL2, and the first and third scan stages NST1a and NST3a that are the adjacent to the second scan stage NST2a may be coupled through the second input terminal IN2 to the first control clock line CCKL1. The first and second control clock lines CCKL1 and CCKL2 may be alternately coupled through the second input terminals IN2 to the scan stages NST1a to NSTna. For example, the odd-numbered scan stages NST1a, NST3a, and NSTna may be coupled through the second input terminals IN2 to the first control clock line CCKL1, and the even-numbered scan stages NST2a and NST4a may be coupled through the second input terminals IN2 to the second control clock line CCKL2. In contrast, the odd-numbered scan stages NST1a, NST3a, and NSTna may be coupled through the second input terminals IN2 to the second control clock line CCKL2, and the even-numbered scan stages NST2a and NST4a may be coupled through the second input terminals IN2 to the first control clock line CCKL1.

Each of the scan stages NSTna to NSTna may be coupled through the third input terminal IN3 thereof to the second control clock line CCKL2 or the first control clock line CCKL1. The control clock line connected through the third input terminal IN3 in each of the scan stages NST1a to NSTna may be different from the control clock line connected through the second input terminal IN2.

The scan stages NST1a to NSTna may be coupled through the first output terminals OUT1 to the scan lines GWNL1, GWNL2, GWNL3, GWNL4, and GWNLn.

In order to reduce a clock frequency or implement other driving methods, the numbers of the power clock lines NCKL1 and NCKL2 and the control clock lines CCKL1 and CCKL2 may be changed.

Hereinafter, a difference between the scan driver 30Na of FIG. 12 and the scan driver 30N of FIG. 9 will be mainly described.

The scan stages NST2a, NST3a, NST4a, and NSTna excluding the first scan stage NSTna may be coupled to the carry lines CRL1, CRL2, CRL3, and CRL(n−1) of previous scan stages. For example, the second scan stage NST2a may be coupled to the first carry line CRL1 of the first scan stage NST1a.

The carry lines CRL1, CRL2, CRL3, CR4, and CRL(n−1) do not require separate external terminals. Therefore, the scan driver 30Na of FIG. 12 and the scan driver 30N of FIG. 9 may include external terminals IN1, IN2, IN3, INF, and OUT1 having the same number and function. That is, the scan driver 30Na of FIG. 12 does not require additional external terminals as compared to the scan driver 30N of FIG. 9.

Figure 13:
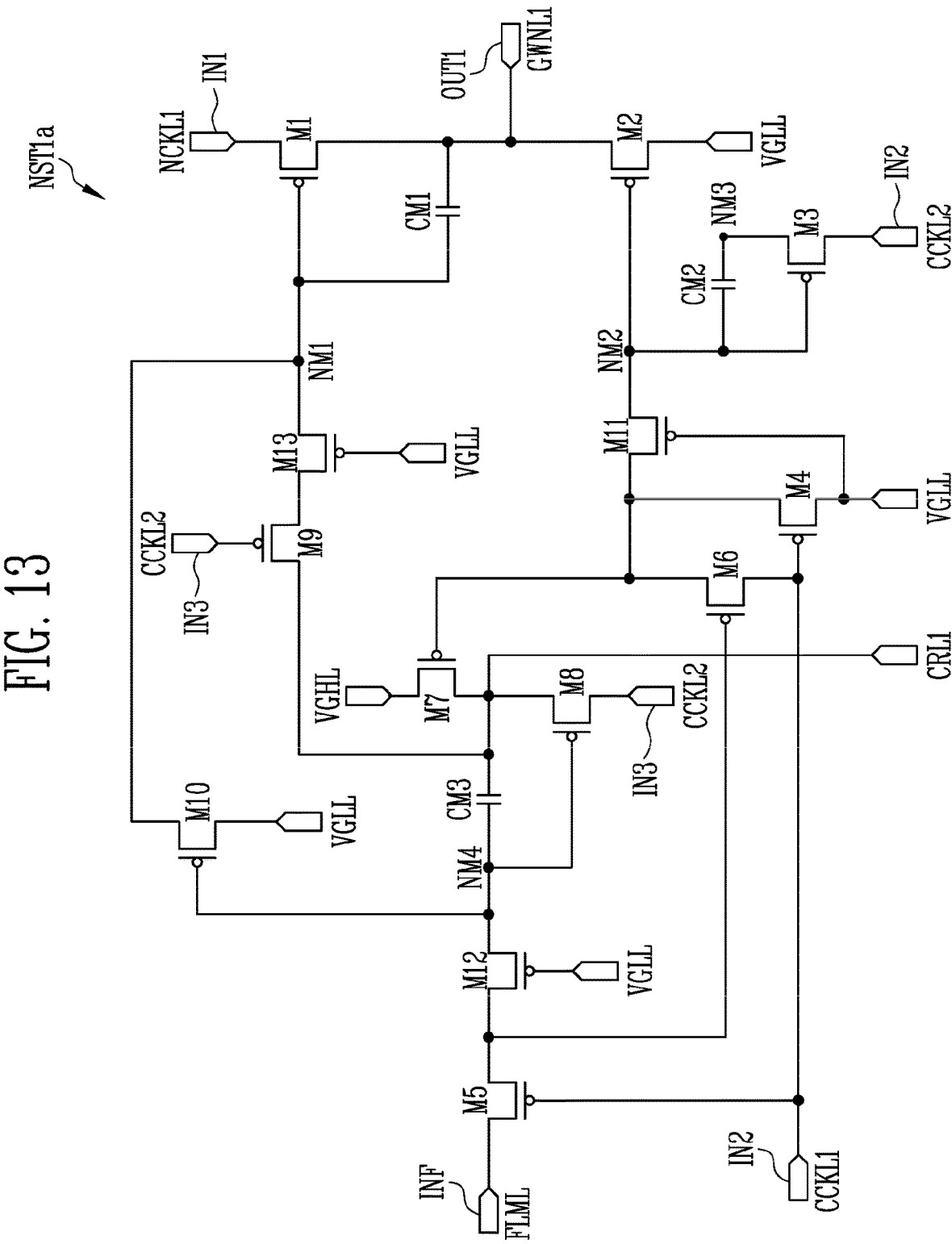
FIG. 13 is a diagram illustrating a scan stage included in the scan driver of FIG. 12.

FIG. 13 is a diagram illustrating a scan stage included in the scan driver of FIG. 12.

Referring to FIG. 13, the first scan stage NST1a of the scan driver 30Na of FIG. 12 is illustrated by way of example. Since other scan stages NST2a, NST3a, NST4a, and NSTna of FIG. 13 have the substantially same configuration as the first scan stage NST1a except that the carry line of the previous scan stage is coupled to the first electrode of the fifth transistor M5, a duplicated description will be omitted herein. The clock lines coupled to the first to third input terminals IN1, IN2, and IN3 refer to the description of FIG. 12.

The first scan stage NST1a may include transistors M1 to M13, and capacitors CM1 to CM3. The transistors M1 to M13 may be of the P-type transistors.

A gate electrode of the first transistor M1 may be coupled to the first node NM1, a first electrode of the first transistor M1 may be coupled to the first power clock line NCKL1, and a second electrode of the first transistor M1 may be coupled to the first scan line GWNL1.

A first electrode of the first capacitor CM1 may be coupled to the first node NM1, and a second electrode thereof may be coupled to the first scan line GWNL1.

A gate electrode of the second transistor M2 may be coupled to the second node NM2, a first electrode of the second transistor M2 may be coupled to the first scan line GWNL1, and a second electrode of the second transistor M2 may be coupled to the first power line VGLL.

A gate electrode of the third transistor M3 may be coupled to the second node NM2, a first electrode of the second transistor M3 may be coupled to the third node NM3, and a second electrode of the second transistor M3 may be coupled to the second control clock line CCKL2.

A first electrode of the second capacitor CM2 may be coupled to the second node NM2, and a second electrode of the second capacitor CM2 may be coupled to the third node NM3.

A gate electrode of the fourth transistor M4 may be coupled to the first control clock line CCKL1, a first electrode of the fourth transistor M4 may be coupled to the second node NM2 through the eleventh transistor M11, and a second electrode of the fourth transistor M4 may be coupled to the first power line VGLL. The eleventh transistor M11 may couple the first electrode of the fourth transistor M4 to the second node NM2 when the eleventh transistor M11 is turned on.

A gate electrode of the fifth transistor M5 may be coupled to the first control clock line CCKL1, a first electrode of the fifth transistor M5 may be coupled to the scan start line FLML, and a second electrode of the fifth transistor M5 may be coupled to the fourth node NM4 through the twelfth transistor M12. The twelfth transistor M12 may couple the second electrode of the fifth transistor M5 to the fourth node NM4 when the twelfth transistor M12 is turned on.

A gate electrode of the sixth transistor M6 may be coupled to the fourth node NM4 through the twelfth transistor M12, a first electrode of the sixth transistor M6 may be coupled to the second node NM2 through the eleventh transistor M11, and a second electrode of the sixth transistor M6 may be coupled to the first control clock line CCKL1. The eleventh transistor M11 may couple the first electrode of the sixth transistor M6 to the second node NM2 when the eleventh transistor M11 is turned on.

A gate electrode of the seventh transistor M7 may be coupled to the second node NM2 through the eleventh transistor M11, a first electrode of the seventh transistor M7 may be coupled to the second power line VGHL, and a second electrode of the seventh transistor M7 may be coupled to the first carry line CRL1. The eleventh transistor M11 may couple the gate electrode of the seventh transistor M7 to the second node NM2 when the eleventh transistor M11 is turned on.

A gate electrode of the eighth transistor M8 may be coupled to the fourth node NM4, a first electrode thereof may be coupled to the first carry line CRL1, and a second electrode thereof may be coupled to the second control clock line CCKL2.

A first electrode of the third capacitor CM3 may be coupled to the fourth node NM4, and a second electrode thereof may be coupled to the first carry line CRL1.

A gate electrode of the ninth transistor M9 may be coupled to the second control clock line CCKL2, a first electrode of the ninth transistor M9 may be coupled to the first carry line CRL1, and a second electrode of the ninth transistor M9 may be coupled to the first node NM1 through the thirteenth transistor M13. The thirteenth transistor M13 may couple the second electrode of the ninth transistor M9 to the first node NM1 when the thirteenth transistor M13 is turned on.

A gate electrode of the tenth transistor M10 may be coupled to the fourth node NM4, a first electrode of the tenth transistor M10 may be coupled to the first node NM1, and a second electrode of the tenth transistor M10 may be coupled to the first power line VGLL.

A gate electrode of the eleventh transistor M11 may be coupled to the first power line VGLL, a first electrode of the eleventh transistor M11 may be coupled to the first electrode of the fourth transistor M4, and a second electrode of the eleventh transistor M11 may be coupled to the second node NM2.

A gate electrode of the twelfth transistor M12 may be coupled to the first power line VGLL, a first electrode of the twelfth transistor M12 may be coupled to the second electrode of the fifth transistor M5, and a second electrode of the twelfth transistor M12 may be coupled to the fourth node NM4.

A gate electrode of the thirteenth transistor M13 may be coupled to the first power line VGLL, a first electrode of the thirteenth transistor M13 may be coupled to the second electrode of the ninth transistor M9, and a second electrode of the thirteenth transistor M13 may be coupled to the first node NM1.

The first scan stage NST1a of FIG. 13 includes the same number of internal elements M1 to M13 and CM1 to CM3 as the first scan stage NST1 of FIG. 10. Therefore, the first scan stage NST1a of FIG. 13 does not need an additional dead space as compared to the first scan stage NST1 of FIG. 10.

Figure 14:
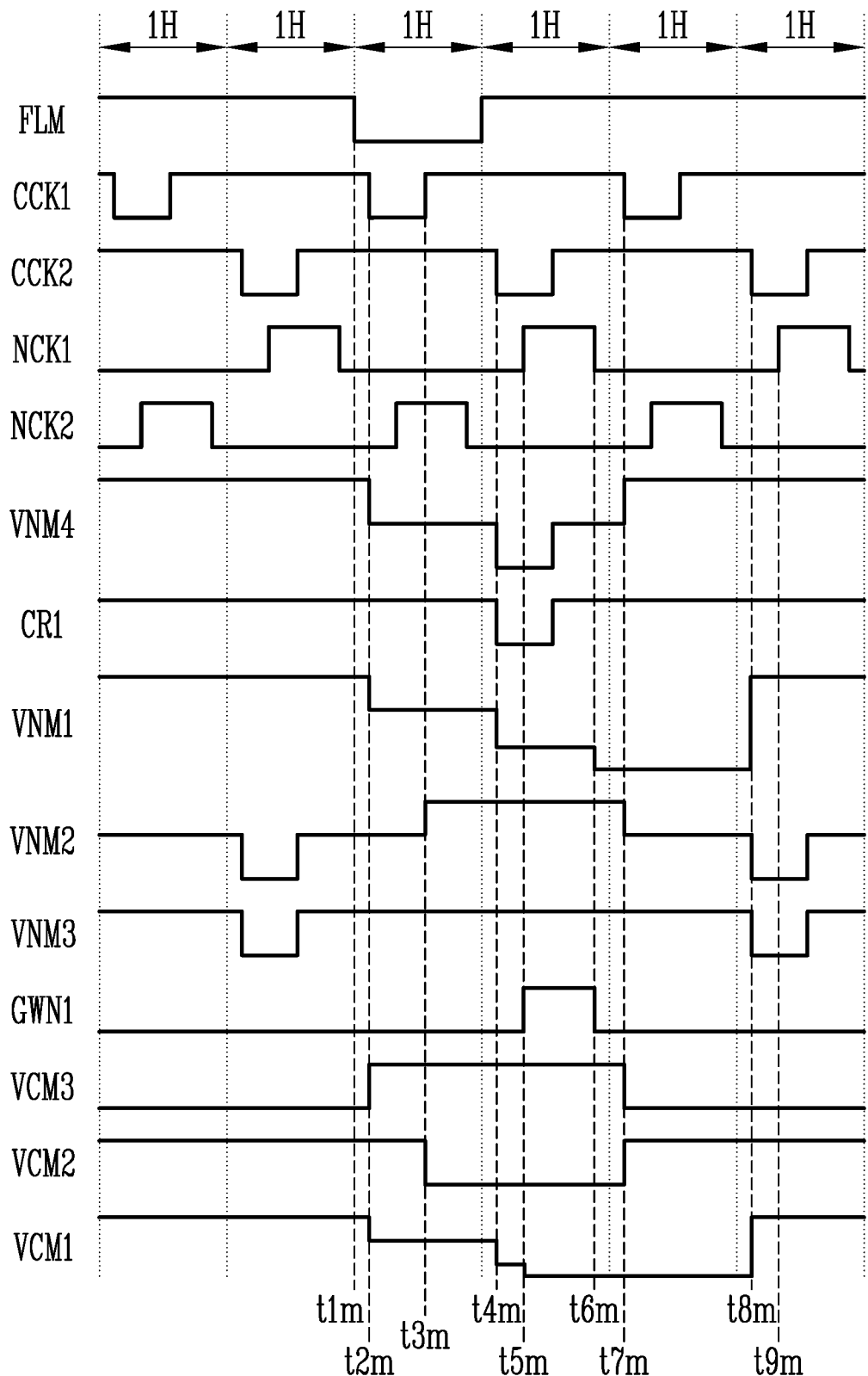
FIG. 14 is a diagram illustrating a method of driving the scan stage of FIG. 13.

FIG. 14 is a diagram illustrating a method of driving the scan stage of FIG. 13.

FIG. 14 illustrates a timing diagram for a scan start signal FLM applied to a scan start line FLML, a first control clock signal CCK1 applied to a first control clock line CCKL1, a second control clock signal CCK2 applied to a second control clock line CCKL2, a first power clock signal NCK1 applied to a first power clock line NCKL1, a second power clock signal NCK2 applied to a second power clock line NCKL2, a first node voltage VNM1 of a first node NM1, a second node voltage VNM2 of a second node NM2, a third node voltage VNM3 of a third node NM3, a fourth node voltage VNP4 of a fourth node NM4, and a first scan signal GWN1 applied to a first scan line GWNL1. An interval between pulses of a horizontal synchronization signal may be referred to as one horizontal period 1H. A first voltage VCM1 is a voltage difference between the first and second electrodes of the first capacitor CM1, a second voltage VCM2 is a voltage difference between the first and second electrodes of the second capacitor CM2, and a third voltage VCM3 is a voltage difference between the first and second electrodes of the third capacitor CM3.

A high-level voltage may be applied to the second power line VGHL, and a low-level voltage may be applied to the first power line VGLL. Since the transistors M11, M12, and M13 having the gate electrodes coupled to the first power line VGLL are turned on for most of the period when describing the driving method, the description of the transistors M11, M12, and M13 will be omitted except for specific cases.

First, at a time point t1m, a scan start signal FLM of the low level (turn-on level) is supplied. At this time, since the fifth transistor M5 is turned off by the first control clock signal CCK1 of the high level, the fourth node voltage VNM4 is not changed.

At a time point t2m, the first control clock signal CCK1 of the low level is supplied. Thereby, the fifth transistor M5 and the fourth transistor M4 are turned on. As the fifth transistor M5 is turned on, the scan start signal FLM of the low level is transmitted to the fourth node NM4, and the fourth node voltage VNM4 drops to the low level.

As the fourth node voltage VNM4 drops, the tenth transistor M10 is turned on, and charges accumulated in the first node NM1 may flow through the tenth transistor M10 to the first power line VGLL. Thus, the voltage of the first node NM1 may drop. However, the first node voltage VNM1 may be larger than the voltage of the first power line VGLL by the threshold voltage of the tenth transistor M10.

At a time point t3m, the first control clock signal CCK1 of the high level is supplied. Thus, the first control clock signal CCK1 of the high level is supplied to the second node NM2 through the sixth transistor M6 that is turned on according to the fourth node voltage VNM4 of the low level and the eleventh transistor that is turned on. Thus, the second node voltage VNM2 rises.

At a time point t4m, the second control clock signal CCK2 of the low level is supplied.

Thus, the second control clock signal CCK2 of the low level is supplied to the first carry line CRL1 through the eighth transistor M8 that is turned on according to the fourth node voltage VNM4 of the low level.

Furthermore, the fourth node voltage VNM4 may drop to a level lower than the low level due to the coupling of the third capacitor CM3. Thus, the voltage having the level lower than the low level may be applied to the gate electrode of the tenth transistor M10. Thus, the low-level voltage of the first power line VGLL may be transmitted to the first node NM1, without being limited by the threshold voltage of the tenth transistor M10. That is, charges accumulated in the first node NM1 may sufficiently flow to the first power line VGLL.

Such a drop of the fourth node voltage VNM4 does not significantly affect the voltage of the second electrode of the fifth transistor M5. Since the low-level voltage is applied to the gate electrode of the twelfth transistor M12, the voltage of the first electrode (source electrode) of the twelfth transistor M12 is prevented from being lower than the sum of the low level and the absolute value of the threshold value of the transistor M12. Therefore, it is possible to prevent a source-drain voltage difference of the turned-off fifth transistor M5 from being excessively increased, thus prolonging the life of the fifth transistor M5.

At a time point t5m, a first power clock signal NCK1 of the high level may be supplied. Since the first transistor M1 is turned on by the first node voltage VNM1, the first power clock signal NCK1 of the high level may be supplied to the first scan line GWNL1 as the first scan signal GWN1.

At a time point t6m, a first power clock signal NCK1 of the low level may be supplied. The first node voltage VNM1 may drop to a level lower than the low level due to the coupling of the first capacitor CM1.

Such a drop of the first node voltage VNM1 does not significantly affect the voltage of the second electrode of the ninth transistor M9. Since the low-level voltage is applied to the gate electrode of the thirteenth transistor M13, the voltage of the first electrode (source electrode) of the thirteenth transistor M13 is prevented from being lower than the sum of the low level and the absolute value of the threshold value of the thirteenth transistor M13. Therefore, it is possible to prevent a source-drain voltage difference of the turned-off ninth transistor M9 from being excessively increased, thus prolonging the life of the ninth transistor M9.

At a time point t7m, a first control clock signal CCK1 of the low level may be supplied. Thus, the fifth transistor M5 is turned on, and the scan start signal FLM of the high level is applied to the fourth node NM4. Furthermore, the fourth transistor M4 may be turned on, and the low-level voltage of the first power line VGLL may be applied to the second node NM2 through the eleventh transistor M11 which is turned on.

At a time point t8m, a second control clock signal CCK2 of the low level may be supplied. The second control clock signal CCK2 of the low level may be supplied to the third node NM3 through the third transistor M3 that is turned on by the second node voltage VNM2 of the low level. Thus, the second node voltage VNM2 drops to a level lower than the low level due to the coupling of the second capacitor CM2. Thus, the low-level voltage of the first power line VGLL may be transmitted to the first scan line GWNL1 without being limited by the threshold voltage of the second transistor M2.

Such a drop of the second node voltage VNM2 does not significantly affect the voltage of the first electrode of the sixth transistor M6. Since the low-level voltage is applied to the gate electrode of the eleventh transistor M11, the voltage of the first electrode (source electrode) of the eleventh transistor M11 is prevented from being lower than the sum of the low level and the absolute value of the threshold value of the eleventh transistor M11. Therefore, it is possible to prevent a source-drain voltage difference of the turned-off sixth transistor M6 from being excessively increased, thus prolonging the life of the sixth transistor M6.

Furthermore, since the ninth transistor M9 is turned on, the high-level voltage of the second power line VGHL is applied through seventh, ninth, and thirteenth transistors M7, M9, and M13 to the first node NM1.

At a time point t9m, a first power clock signal NCK1 of the high level may be supplied. However, since the first transistor M1 is kept turned-off by the first node voltage VNM1 of the high level, the voltage of the first scan line GWNL1 maintains the low level.

A time other than times t1m to t9m for supplying the first scan signal GWN1 of the high level occupies most of the time of the frame period (approximately 99% of the frame period). Referring to FIG. 14, it can be seen that voltages VCM1, VCM2, and VCM3 on both ends of the capacitors CM1, CM2, and CM3 are not changed before the time point t1m and after the time period t9m. That is, since the charging and discharging of the capacitors CM1, CM2, and CM3 are prevented in most of the frame period, power consumption can be reduced.

Referring to comparative examples of FIGS. 10 and 11, voltages VCP3 on both ends of the capacitor CP3 continuously change even before the time point t1p and after the time point t7p. That is, since the charging and discharging of the capacitor CP3 occur continuously, power consumption is slightly larger than that in the embodiment of FIGS. 13 and 14.

Furthermore, referring to the comparative examples of FIGS. 10 and 11, there is a problem in that the node voltage VNP3 does not sufficiently fall at time point t3p, so that a sufficient source-drain voltage difference is not provided to the transistor P10. That is, when the second control clock signal CCK2 of the low level is supplied through the transistor P8 to the node NP3, it is limited by the threshold voltage of the transistor P8. Furthermore, at the time point t4p, the first power clock signal NCK1 may be increased, and an increase in node voltage VNP3 may be induced by the coupling of the capacitor CP1.

In contrast, according to the embodiment of FIGS. 13 and 14, as described above, at the time point t4m, the low-level voltage of the first power line VGLL may be transmitted to the first node NM1 without being limited by the threshold voltage of the tenth transistor M10. Therefore, at the time point t4m, the voltage of the first node NM1 may be sufficiently lowered and a sufficient source-drain voltage difference may be provided to the first transistor M1. Furthermore, even if the first power clock signal NCK1 increases at the time point t5m, there is no capacitor for coupling the first power clock line NCKL1 to the first node NM1 so that the rise of the first node voltage VNM1 is not induced.

Figure 15:
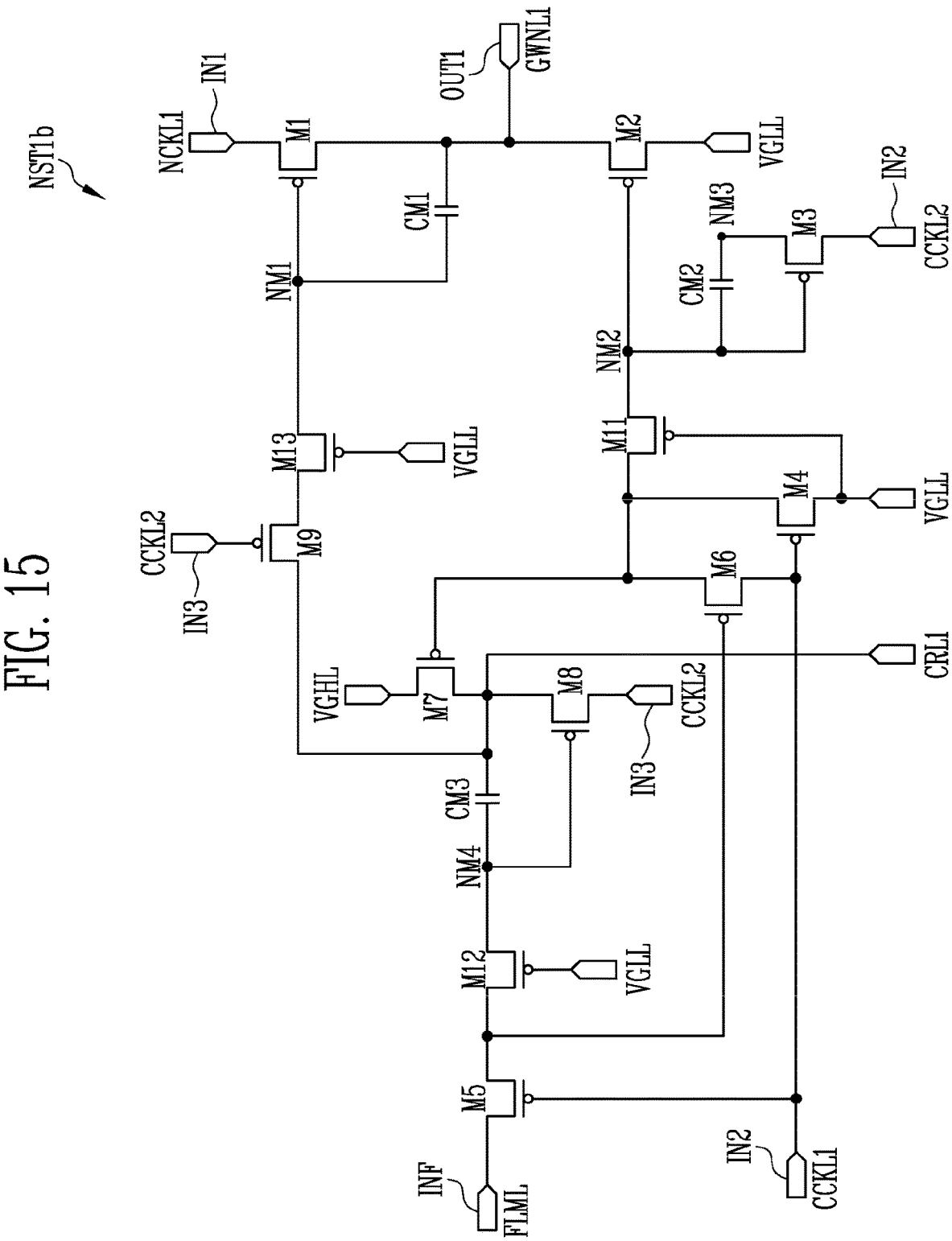
FIG. 15 illustrates a modification of the scan stage of FIG. 13.
Figure 16:
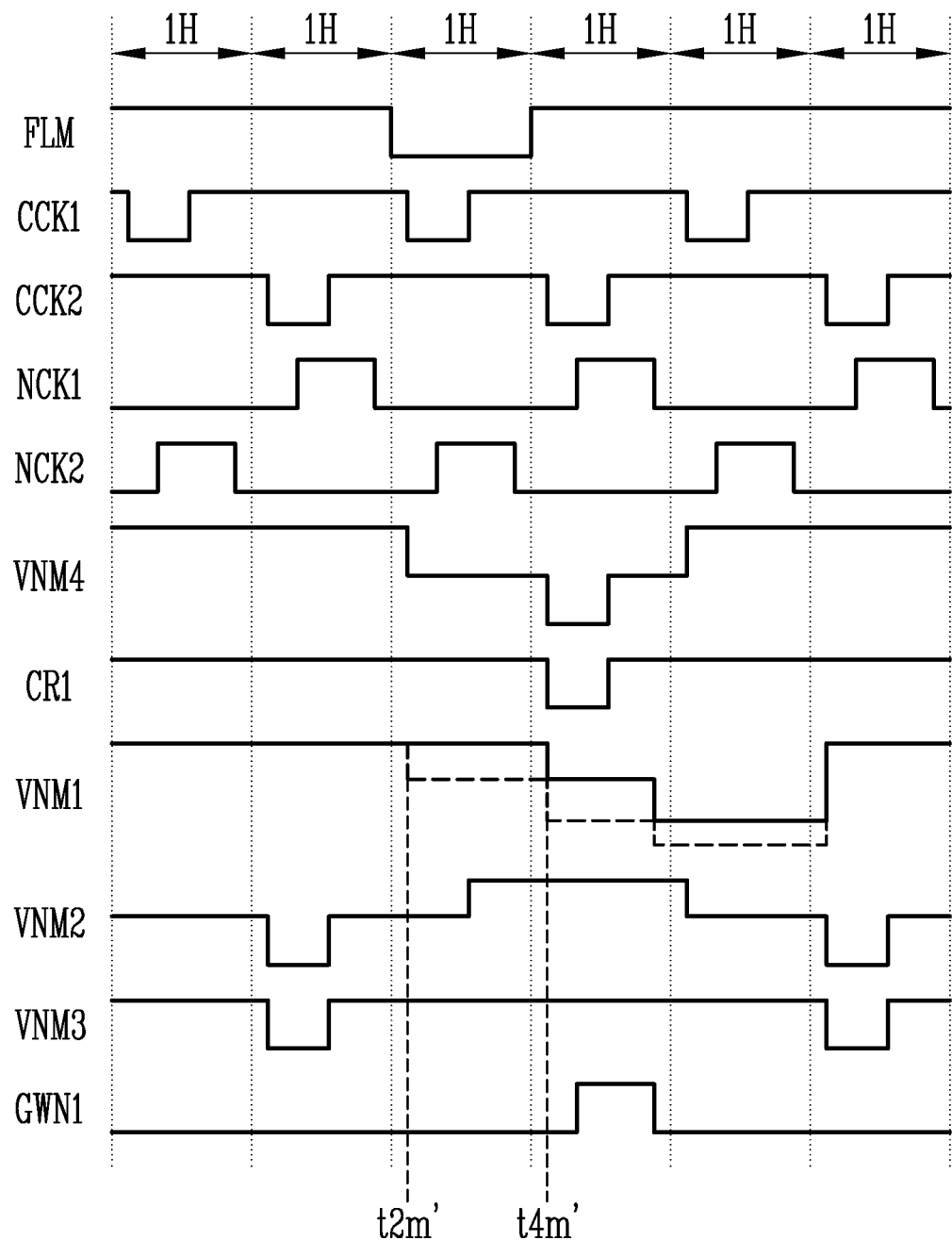
FIG. 16 is a diagram illustrating a method of driving the scan stage of FIG. 15.

FIG. 15 illustrates a modification of the scan stage of FIG. 13, and FIG. 16 is a diagram illustrating a method of driving the scan stage of FIG. 15.

The first scan stage NST1b of FIG. 15 is different from the first scan stage NST1a of FIG. 13 except that the former does not include the tenth transistor M10. Since other configurations remain the same, a duplicated description thereof will be omitted herein.

Referring to FIG. 16, the first node voltage VNM1 of the first scan stage NST1b does not drop at a time point t2m'. The first node voltage VNM1 of the first scan stage NST1b starts to drop from a time point t4m'. The time point t2m' of FIG. 16 may correspond to the time point t2m of FIG. 14, and the time point t4m' of FIG. 16 may correspond to the time point t4m of FIG. 14 (see dashed waveform).

The first scan stage NST1b of FIG. 16 may reduce a dead space by removing the tenth transistor M10.

Figure 17:
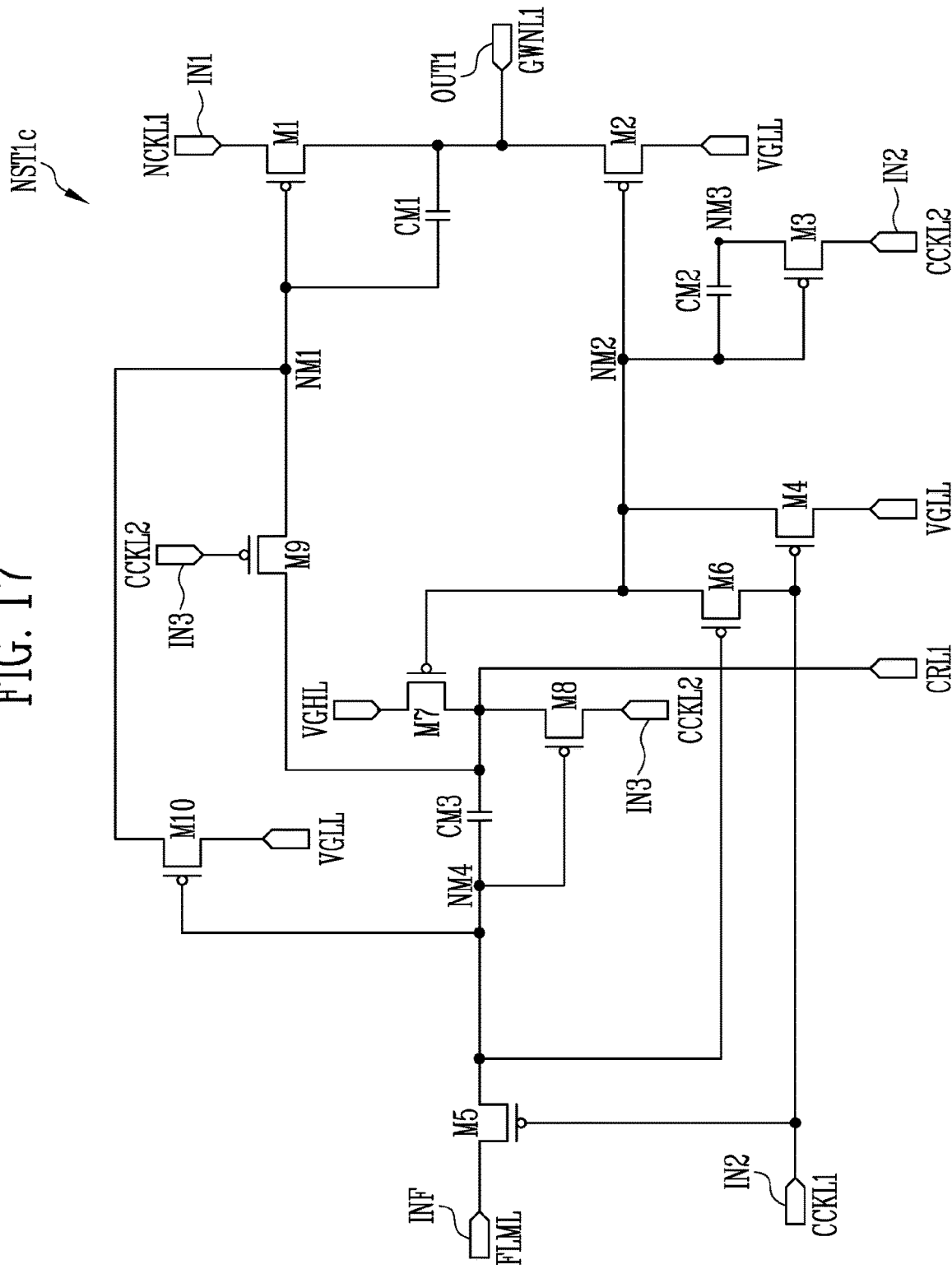
FIG. 17 illustrates another modification of the scan stage of FIG. 13.

FIG. 17 illustrates another modification of the scan stage of FIG. 13.

The first scan stage NST1c of FIG. 17 is different from the first scan stage NST1a of FIG. 13 except that the former does not include the eleventh, twelfth, and thirteenth transistors M11, M12, and M13. Since other configurations remain the same, a duplicated description thereof will be omitted herein.

The first scan stage NST1c may reduce a dead space by removing the eleventh, twelfth, and thirteenth transistors M11, M12, and M13.

Figure 18:
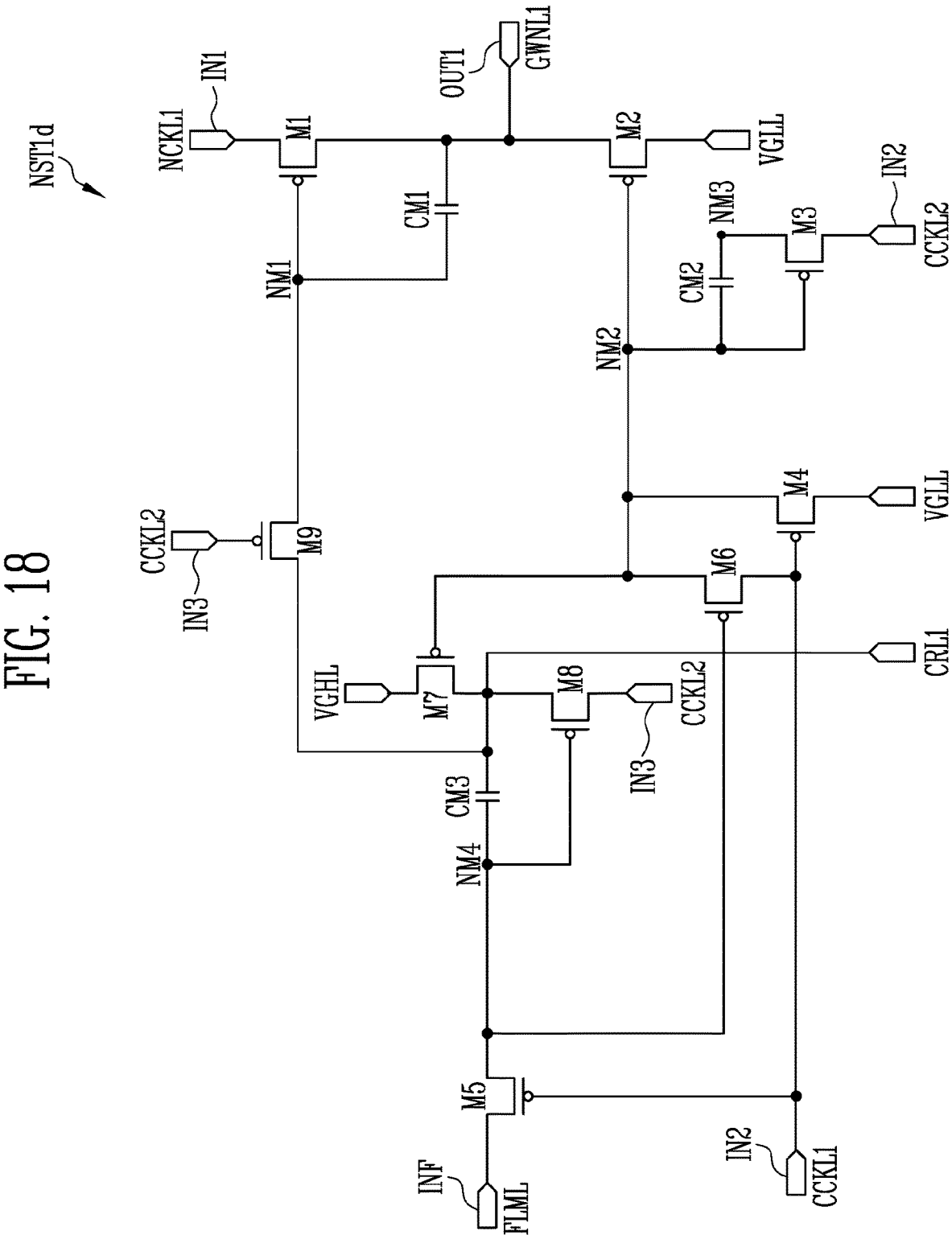
FIG. 18 illustrates a further modification of the scan stage of FIG. 13.

FIG. 18 illustrates a further modification of the scan stage of FIG. 13.

The first scan stage NST1d of FIG. 18 is different from the first scan stage NST1a of FIG. 13 except that the former does not include the tenth, eleventh, twelfth, and thirteenth transistors M10, M11, M12, and M13. Since other configurations remain the same, a duplicated description thereof will be omitted herein.

The first scan stage NST1d may reduce a larger dead space than the first scan stages NST1a, NST1b, and NST1c of FIGS. 13, 15, and 17.

A scan driver and a display device including the scan driver according to the present disclosure can sufficiently increase a voltage difference between a gate electrode and a source electrode of a buffer transistor without providing additional external terminals or internal elements, and can minimize the charge and discharge of internal capacitors.

The detailed description of the disclosure described with reference to the drawings is merely illustrative, which is used only for the purpose of describing the disclosure and is not used to limit the meaning or scope of the disclosure as defined in the accompanying claims. Therefore, those skilled in the art will understand that various modifications and equivalences thereof are possible. Accordingly, the bounds and scope of the present inventive concept should be determined by the technical spirit of the following claims.

What is claimed is:

1. A scan driver, comprising:
   a plurality of scan stages,
   wherein a first scan stage of the plurality of scan stages comprises:
   a first transistor including a gate electrode coupled to a first node, a first electrode coupled to a first power clock line, and a second electrode coupled to a first scan line;
   a first capacitor including a first electrode coupled to the first node, and a second electrode coupled to the first scan line;
   a second transistor including a gate electrode coupled to a second node, a first electrode coupled to the first scan line, and a second electrode coupled to a first power line;
   a third transistor including a gate electrode coupled to the second node, a first electrode coupled to a third node, and a second electrode coupled to a first control clock line; and
   a second capacitor including a first electrode coupled to the second node, and a second electrode coupled to the third node, and
   wherein the first power line and the first control clock line are separated.

2. The scan driver according to claim 1, wherein the first scan stage further comprises a fourth transistor including a gate electrode coupled to a second control clock line, a first electrode coupled to the second node, and a second electrode coupled to the first power line.

3. The scan driver according to claim 2, wherein the first scan stage further comprises a fifth transistor including a gate electrode coupled to the second control clock line, a first electrode coupled to a scan start line, and a second electrode coupled to a fourth node.

4. The scan driver according to claim 3, wherein the first scan stage further comprises a sixth transistor including a gate electrode coupled to the fourth node, a first electrode coupled to the second node, and a second electrode coupled to the second control clock line.

5. The scan driver according to claim 4, wherein the first scan stage further comprises a seventh transistor including a gate electrode coupled to the second node, a first electrode coupled to a second power line, and a second electrode coupled to a first carry line.

6. The scan driver according to claim 5, wherein the first scan stage further comprises an eighth transistor including a gate electrode coupled to the fourth node, a first electrode coupled to the first carry line, and a second electrode coupled to the first control clock line.

7. The scan driver according to claim 6, wherein the first scan stage further comprises a third capacitor including a first electrode coupled to the fourth node, and a second electrode coupled to the first carry line.

8. The scan driver according to claim 7, wherein the first scan stage further comprises a ninth transistor including a gate electrode coupled to the first control clock line, a first electrode coupled to the first carry line, and a second electrode coupled to the first node.

9. The scan driver according to claim 8, wherein the first scan stage further comprises a tenth transistor including a gate electrode coupled to the fourth node, a first electrode coupled to the first node, and a second electrode coupled to the first power line.

10. The scan driver according to claim 9, wherein the first scan stage further comprises:
an eleventh transistor configured to couple the first electrode of the fourth transistor to the second node, and
the eleventh transistor comprises a gate electrode coupled to the first power line, a first electrode coupled to the first electrode of the fourth transistor, and a second electrode coupled to the second node.

11. The scan driver according to claim 10, wherein the first scan stage further comprises:
a twelfth transistor configured to couple the second electrode of the fifth transistor to the fourth node, and
the twelfth transistor comprises a gate electrode coupled to the first power line, a first electrode coupled to the second electrode of the fifth transistor, and a second electrode coupled to the fourth node.

12. The scan driver according to claim 11, wherein the first scan stage further comprises:
a thirteenth transistor configured to couple the second electrode of the ninth transistor to the first node, and
the thirteenth transistor comprises a gate electrode coupled to the first power line, a first electrode coupled to the second electrode of the ninth transistor, and a second electrode coupled to the first node.

13. The scan driver according to claim 12, wherein the plurality of scan stages comprises a second scan stage coupled to a second power clock line, the first control clock line, the second control clock line, the first carry line, a second carry line, and a second scan line.

14. A display device comprising a scan driver including:
a pixel unit driven in a first display mode during a first period, and driven in a second display mode during a second period having a same time interval as the first period; and
a plurality of scan stages coupled through a plurality of scan lines to the pixel unit,
wherein a first cycle in which the plurality of scan stages supplies turn-on level of scan signals during the first period is shorter than a second cycle in which the plurality of scan stages supplies the turn-on level of scan signals during the second period,
wherein a first scan stage of the plurality of scan stages comprises:
a first transistor including a gate electrode coupled to a first node, a first electrode coupled to a first power clock line, and a second electrode coupled to a first scan line;
a first capacitor including a first electrode coupled to the first node, and a second electrode coupled to the first scan line;
a second transistor including a gate electrode coupled to a second node, a first electrode coupled to the first scan line, and a second electrode coupled to a first power line;
a third transistor including a gate electrode coupled to the second node, a first electrode coupled to a third node, and a second electrode coupled to a first control clock line; and
a second capacitor including a first electrode coupled to the second node, and a second electrode coupled to the third node, and
wherein the first power line and the first control clock line are separated.

15. The display device according to claim 14, wherein the first scan stage further comprises:
a fourth transistor including a gate electrode coupled to a second control clock line, a first electrode coupled to the second node, and a second electrode coupled to the first power line; and
a fifth transistor including a gate electrode coupled to the second control clock line, a first electrode coupled to a scan start line, and a second electrode coupled to a fourth node.

16. The display device according to claim 15, wherein the first scan stage further comprises:
a sixth transistor including a gate electrode coupled to the fourth node, a first electrode coupled to the second node, and a second electrode coupled to the second control clock line; and
a seventh transistor including a gate electrode coupled to the second node, a first electrode coupled to a second power line, and a second electrode coupled to a first carry line.

17. The display device according to claim 16, wherein the first scan stage further comprises:
an eighth transistor including a gate electrode coupled to the fourth node, a first electrode coupled to the first carry line, and a second electrode coupled to the first control clock line; and
a third capacitor including a first electrode coupled to the fourth node, and a second electrode coupled to the first carry line.

18. The display device according to claim 17, wherein the first scan stage further comprises:
a ninth transistor including a gate electrode coupled to the first control clock line, a first electrode coupled to the first carry line, and a second electrode coupled to the first node; and
a tenth transistor including a gate electrode coupled to the fourth node, a first electrode coupled to the first node, and a second electrode coupled to the first power line.

19. The display device according to claim 18, wherein the first scan stage further comprises:
an eleventh transistor configured to couple the first electrode of the fourth transistor to the second node, and
the eleventh transistor comprises a gate electrode coupled to the first power line, a first electrode coupled to the first electrode of the fourth transistor, and a second electrode coupled to the second node.

20. The display device according to claim 19,
wherein the first scan stage further comprises:
a twelfth transistor configured to couple the second electrode of the fifth transistor to the fourth node; and
a thirteenth transistor configured to couple the second electrode of the ninth transistor to the first node,
wherein the twelfth transistor comprises a gate electrode coupled to the first power line, a first electrode coupled to the second electrode of the fifth transistor, and a second electrode coupled to the fourth node, and
wherein the thirteenth transistor comprises a gate electrode coupled to the first power line, a first electrode coupled to the second electrode of the ninth transistor, and a second electrode coupled to the first node.

* * * * *